United States Patent
Forrest et al.

(10) Patent No.: US 11,895,853 B2
(45) Date of Patent: Feb. 6, 2024

(54) ORGANIC PHOTOVOLTAIC DEVICE HAVING A LATERAL CHARGE TRANSPORT CHANNEL

(71) Applicant: The Regents of the University of Michigan, Ann Arbor, MI (US)

(72) Inventors: Stephen Forrest, Ann Arbor, MI (US); Quinn Burlingame, Ann Arbor, MI (US); Caleb Coburn, Ypsilanti, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 695 days.

(21) Appl. No.: 16/722,709

(22) Filed: Dec. 20, 2019

(65) Prior Publication Data
US 2020/0235325 A1 Jul. 23, 2020

Related U.S. Application Data

(60) Provisional application No. 62/793,707, filed on Jan. 17, 2019.

(51) Int. Cl.
*H10K 30/82* (2023.01)
*H10K 85/20* (2023.01)

(52) U.S. Cl.
CPC ........... *H10K 30/82* (2023.02); *H10K 85/215* (2023.02)

(58) Field of Classification Search
CPC ... H01L 51/442; H01L 51/0047; H10K 30/82; H10K 85/215
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |

(Continued)

FOREIGN PATENT DOCUMENTS

| | | | |
|---|---|---|---|
| CN | 102751342 A | * | 10/2012 |
| EP | 1238981 | | 9/2002 |

(Continued)

OTHER PUBLICATIONS

Yong et al., CN 102751342 A, English Machine Translation, pp. 1-10. (Year: 2012).*

(Continued)

*Primary Examiner* — Tae-Sik Kang
(74) *Attorney, Agent, or Firm* — Riverside Law LLP

(57) ABSTRACT

Organic photovoltaic cells (OPVs) and their compositions are described herein. In one or more embodiments, the OPV or solar cell includes a first electrode (e.g., cathode); a second electrode (e.g., anode); an active layer positioned between the first electrode and the second electrode; and a channel layer positioned between the first electrode and the active layer, wherein the channel layer is configured to laterally disperse a charge across the channel layer. In certain examples, the first electrode is arranged in a grid structure having a plurality of electrode segments and a respective opening between adjacent segments of the first electrode.

17 Claims, 13 Drawing Sheets

(56) References Cited

U.S. PATENT DOCUMENTS

| | | | |
|---|---|---|---|
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2003/0230980 | A1 | 12/2003 | Forrest |
| 2004/0174116 | A1 | 9/2004 | Lu |
| 2011/0303904 | A1* | 12/2011 | Avasthi ............... H01L 51/4273 257/40 |
| 2013/0026452 | A1 | 1/2013 | Kottas |
| 2013/0119354 | A1 | 5/2013 | Ma |
| 2016/0343966 | A1* | 11/2016 | Forrest ................ H01G 9/2059 |
| 2017/0005284 | A1* | 1/2017 | Che ...................... H10K 30/211 |
| 2017/0062745 | A1 | 3/2017 | Lee |
| 2017/0237010 | A1 | 8/2017 | Facchetti |

FOREIGN PATENT DOCUMENTS

| | | | |
|---|---|---|---|
| JP | 2010135467 | | 6/2010 |
| KR | 20110127307 | A | 11/2011 |
| WO | 2004111066 | | 12/2004 |
| WO | 2008044723 | | 4/2008 |
| WO | 2008057394 | | 5/2008 |
| WO | 2010011390 | | 1/2010 |
| WO | 2010111175 | | 9/2010 |
| WO | WO-2014169270 | A2 * | 10/2014 ......... H01L 51/4273 |

OTHER PUBLICATIONS

Fratini et al., "Charge transport in high-mobility conjugated polymers and molecular semiconductors", Nature Materials, vol. 19, May 2020, 491-502. (Year: 2020).*

Tchutchulashvili, et al., "GaN Nanowire Array for Charge Transfer in Hybrid GaN/P3HT:PC71BM Photovoltaic Heterostructure Fabricated on Silicon", Materials 2020, 13, 4755. (Year: 2020).*

Yoon et al., "High Efficiency (>17%) Si-Organic Hybrid Solar Cells by Simultaneous Structural, Electrical, and Interfacial Engineering via Low-Temperature Processes", Adv. Energy Mater. 2018, 8, 1702655. (Year: 2018).*

Yilmaz et al., "Operational Stability and Degradation of Organic Solar Cells", Periodicals of Engineering and Natural Sciences, ISSN 2303-4521, vol. 5, No. 2, Jun. 2017, pp. 152-160. (Year: 2017).*

Anthopoulos, T. D. et al. High performance n-channel organic field-effect transistors and ring oscillators based on C60 fullerene films. Appl. Phys. Lett. 89, 213504 (2006) 3 pages.

Baldo et al., "Highly Efficient Phosphorescent Emission from Organic Electroluminescent Devices," Nature, vol. 395,151-154, (1998).

Baldo et al., "Very high-efficiency green organic light-emitting devices based on electrophosphorescence," Appl. Phys. Lett., vol. 75, No. 3, 4-6 (1999).

Bässler, H. Charge transport in disordered organic photoconductors. Phys. Status Solidi B 175, 15-56 (1993).

Bürgi, L., Friend, R. H. & Sirringhaus, H. Formation of the accumulation layer in polymer field-effect transistors. Appl. Phys. Lett. 82, 1482-1484 (2003).

Burlingame et al., "Centimetre-scale electron diffusion in photoactive organic heterostructures", Nature vol. 554, pp. 77-80 (2018) Jan. 18, 2018; [online] <https://www.nature.com/articles/nature25148 > 8 pages.

Burlingame, Q. et al. Reliability of small molecule organic photovoltaics with electron-filtering compound buffer layers. Adv. Energy Mater. 6, 1601094 (2016) 11 pages.

Cheyns, D., Kim, M., Verreet, B. & Rand, B. P. Accurate spectral response measurements of a complementary absorbing organic tandem cell with fill factor exceeding the subcells. Appl. Phys. Lett. 104, 093302 (2014) 4 pages.

Coropceanu, V. et al. Charge transport in organic semiconductors. Chem. Rev. 107, 926-952 (2007).

Griffith, O. L. et al. Charge transport and exciton dissociation in organic solar cells consisting of dipolar donors mixed with C70. Phys. Rev. B 92, 085404 (2015) 9 pages.

Haddon, R. C. C70 thin film transistors. J. Am. Ceram. Soc. 118, 3041-3042 (1996).

International Search Report and Written Opinion for App. No. PCT/US20/14096, dated Apr. 14, 2020, 11 pages.

Itaka, K. et al. High-mobility C60 field-effect transistors fabricated on molecular-wetting controlled substrates. Adv. Mater. 18, 1713-1716 (2006).

Jarrett, C. P., Pichler, K., Newbould, R. & Friend, R. H. Transport studies in C60 and C60/C70 thin films using metal-insulator-semiconductor field-effect transistors. Synth. Met. 77, 35-38 (1996).

Jurchescu, O. D., Popinciuc, M., Van Wees, B. J. & Palstra, T. T. M. Interface-controlled, high-mobility organic transistors. Adv. Mater. 19, 688-692 (2007).

Kim, M. et al. Lateral organic solar cells with self-assembled semiconductor nanowires. Adv. Energy Mater. 5, 1401317 (2015) 8 pages.

Kwiatkowski, J. J., Frost, J. M. & Nelson, J. The effect of morphology on electron field-effect mobility in disordered C60 thin films. Nano Lett. 9, 1085-1090 (2009).

Leijtens, T., Lim, J., Teuscher, J., Park, T. & Snaith, H. J. Charge density dependent mobility of organic hole-transporters and mesoporous TiO2 determined by transient mobility spectroscopy: implications to dye-sensitized and organic solar cells. Adv. Mater. 25, 3227-3233 (2013).

Liu, X., Ding, K., Panda, A. & Forrest, S. R. Charge transfer states in dilute donor-acceptor blend organic heterojunctions. ACS Nano 10, 7619-7626 (2016).

Meng et al., "Organic and solution-processed tandem solar cells with 17.3% efficiency", Science vol. 361, Issue 6407, pp. 1094-1098; Sep. 14, 2018; [online] <https://science.sciencemag.org/content/361/6407/1094.full > 5 pages.

Nunomura, S., Che, X. & Forrest, S. R. Charge trapping in mixed organic donor-acceptor semiconductor thin films. Adv. Mater. 26, 7555-7560 (2014).

Olthof, S. et al. Ultralow doping in organic semiconductors: evidence of trap filling. Phys. Rev. Lett. 109, 176601 (2012) 5 pages.

Roichman, Y. & Tessler, N. Generalized Einstein relation for disordered semiconductors—implications for device performance. Appl. Phys. Lett. 80, 1948-1950 (2002).

Sakanoue, T. & Sirringhaus, H. Band-like temperature dependence of mobility in a solution-processed organic semiconductor. Nat. Mater. 9, 736-40 (2010).

Sarkar, D. & Halas, N. J. Dember effect in C60 thin films. Solid State Commun. 90, 261-265 (1994).

Ting, H. C. et al. Benzochalcogenodiazole-based donor-acceptor-acceptor molecular donors for organic solar cells. ChemSusChem 7, 457-465 (2014).

Torricelli, F., Colalongo, L., Raiteri, D., Kovács-Vajna, Z. M. & Cantatore, E. Ultra-high gain diffusion-driven organic transistor. Nat. Commun. 7, 10550 (2016) 9 pages.

Tripathi, A. K., Tripathi, D. C. & Mohapatra, Y. N. Simultaneous and direct measurement of carrier diffusion constant and mobility in organic semiconductors and deviation from standard Einstein relation. Phys. Rev. B 84, 3-6 (2011).

Tummala, N. R., Zheng, Z., Aziz, S. G., Coropceanu, V. & Brédas, J.-L. Static and dynamic energetic disorders in the C60, PC61BM, C70, and PC71BM fullerenes. J. Phys. Chem. Lett. 6, 3657-3662 (2015).

Wang, N. et al. Snow cleaning of substrates increases yield of large-area organic photovoltaics. Appl. Phys. Lett. 101, 133901 (2012) 4 pages.

(56) References Cited

OTHER PUBLICATIONS

Xiao, X., Bergemann, K. J., Zimmerman, J. D., Lee, K. & Forrest, S. R. Small-molecule planar-mixed heterojunction photovoltaic cells with fullerene-based electron filtering buffers. Adv. Energy Mater. 4, 1301557 (2014) 5 pages.

Xue, J., Rand, B. P., Uchida, S. & Forrest, S. R. A Hybrid planar-mixed molecular heterojunction photovoltaic cell. Adv. Mater. 17, 66-71 (2005).

* cited by examiner

ORGANIC PHOTOVOLTAIC DEVICE HAVING A LATERAL CHARGE TRANSPORT CHANNEL

CROSS-REFERENCE TO RELATED APPLICATIONS

This application claims priority to U.S. Provisional Patent Application No. 62/793,707, filed on Jan. 17, 2019, incorporated herein by reference in its entirety.

STATEMENT REGARDING FEDERALLY SPONSORED RESEARCH

This invention was made with government support under DE-EE0006708 and DE-EE0005310 awarded by the Department of Energy and FA9550-14-1-0245 awarded by the United States Air Force Office of Scientific Research. The government has certain rights in the invention.

TECHNICAL FIELD

The present disclosure generally relates to electrically active, optically active, solar, and semiconductor devices, and in particular, to organic photovoltaic cells having channel layers configured to laterally disperse a charge across the layer.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, may be used to drive power consuming loads to provide, for example, lighting, heating, or to power electronic circuitry or devices such as calculators, radios, computers or remote monitoring or communications equipment. These power generation applications may involve the charging of batteries or other energy storage devices so that operation may continue when direct illumination from the sun or other light sources is not available, or to balance the power output of the PV device with the specific applications requirements.

Traditionally, photosensitive optoelectronic devices have been constructed of a number of inorganic semiconductors, e.g., crystalline, polycrystalline and amorphous silicon, gallium arsenide, cadmium telluride, and others.

More recent efforts have focused on the use of organic photovoltaic (OPV) cells to achieve acceptable photovoltaic conversion efficiencies with economical production costs. OPVs offer a low-cost, light-weight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or sub-cells.

The unique properties of organic semiconductors, such as flexibility and lightness, are increasingly important for information displays, lighting, and energy generation. Unfortunately, OPV cells may suffer from both static and dynamic disorder. This may lead to variable-range carrier hopping, which results in notoriously poor electrical properties with low electron and hole mobilities and correspondingly short charge-diffusion lengths of less than a micrometer.

Additionally, the power conversion efficiency (PCE) for conventional OPV cells have been less than the reported benchmark for market viability of 15%.

As such, there remains a need to develop OPV cells, devices, and systems with improved lateral charge transport and power efficiency.

SUMMARY

Organic photovoltaic cells (OPVs) and their compositions are described herein. In one or more embodiments, the OPV or solar cell includes: a first electrode (e.g., cathode); a second electrode (e.g., anode); an active layer positioned between the first electrode and the second electrode; and a channel layer positioned between the first electrode and the active layer, wherein the channel layer is configured to laterally disperse a charge across the channel layer. In certain examples, the first electrode is arranged in a grid structure having a plurality of electrode segments and a respective opening between adjacent segments of the first electrode.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1A:
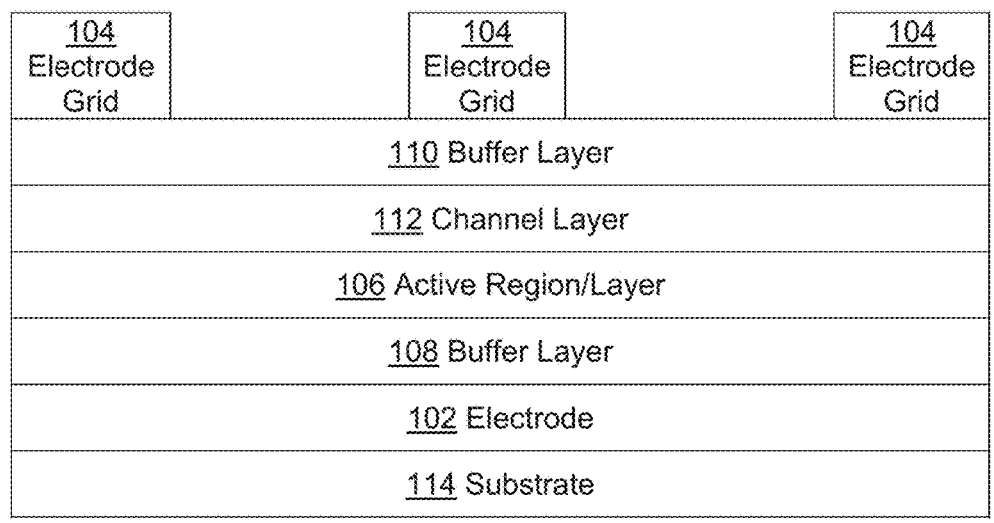
FIG. 1A depicts a cross-sectional view of an exemplary organic photovoltaic (OPV) device having a channel layer. Due to the presence of the channel layer, the device generates current in response to photons incident on the areas between cathode/anode overlap (e.g., off the grid). This device may be illuminated from the transparent side or grid side, and the dimensions of the grid may vary from hundreds of microns to centimeters in pitch spacing. The increased charge carrier density at the collection area (electrode overlap) may increase the OPV voltage, increasing its power conversion efficiency.

While the disclosed devices and systems are representative of embodiments in various forms, specific embodiments are illustrated in the drawings (and are hereafter described), with the understanding that the disclosure is intended to be illustrative and is not intended to limit the claim scope to the specific embodiments described and illustrated herein.

DETAILED DESCRIPTION

Various non-limiting examples of OPVs and compositions within various layers of an OPV are described in greater detail below.

Definitions

As used herein, the terms "electrode" and "contact" may refer to a layer that provides a medium for delivering current to an external circuit or providing a bias current or voltage to the device. For example, an electrode, or contact, may provide the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to a material that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts or electrodes should be minimally absorbing and minimally reflecting of the incident electromagnetic radiation. In some cases, such a contact should be transparent or at least semi-transparent. In one embodiment, the transparent material may form at least part of an electrical contact or electrode.

As used herein, the term "semi-transparent" may refer to a material that permits some, but less than 50% transmission of ambient electromagnetic radiation in relevant wavelengths. Where a transparent or semi-transparent electrode is used, the opposing electrode may be a reflective material so that light which has passed through the cell without being absorbed is reflected back through the cell.

As used and depicted herein, a "layer" refers to a member or component of a device, for example an optoelectronic device, being principally defined by a thickness, for example in relation to other neighboring layers, and extending outward in length and width. It should be understood that the term "layer" is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the length and width may be disturbed or otherwise interrupted by other layer(s) or material(s).

As used herein, a "photoactive region" refers to a region of a device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" ($E_g$) of a polymer may refer to the energy difference between the HOMO and the LUMO. The band gap is typically reported in electron volts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state ($S_1$) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, "power conversion efficiency" (PCE) ($\eta_p$) may be expressed as:

$$\eta_p = \frac{V_{OC} * FF * J_{SC}}{P_O}$$

wherein $V_{oc}$ is the open circuit voltage, FF is the fill factor, $J_{sc}$ is the short circuit current, and $P_o$ is the input optical power.

As used herein, "spin coating" may refer to the process of solution depositing a layer or film of one material (i.e., the coating material) on a surface of an adjacent substrate or layer of material. The spin coating process may include applying a small amount of the coating material on the center of the substrate, which is either spinning at low speed or not spinning at all. The substrate is then rotated at high speed in order to spread the coating material by centrifugal force. Rotation is continued while the fluid spins off the edges of the substrate, until the desired thickness of the film is achieved. The applied solvent is usually volatile, and simultaneously evaporates. Therefore, the higher the angular speed of spinning, the thinner the film. The thickness of the film also depends on the viscosity and concentration of the solution and the solvent.

Organic Photovoltaic Cells

As disclosed herein, the various compositions or molecules may be provided within a solar cell or organic photovoltaic (OPV) cell. As supported by the Example section below, the various compositions or molecules for an OPV cell disclosed herein may be advantageous in providing one or more improvements over conventionally known OPV cells. Specifically, the various OPV cell layers and devices may provide an improved power conversion efficiency over conventionally known OPV cells and devices.

As disclosed herein, the improved OPV cells and devices may include a channel layer configured to improve lateral dispersion of a charge across the layer and improve overall power generation or power efficiency of the OPV cell/device. Additionally, or alternatively, the improved OPV cells and devices may include a sparse metal grid or thin metal finger electrode (e.g., cathode) that may improve the transparency of the OPV cell. These embodiments, along with additional embodiments of the improved OPV cell compositions are discussed in greater detail below.

Although devices may be described herein for use in OPV cells, it is understood that devices, layer configurations, and methods of the present disclosure may also be used in a variety of other optoelectronic devices, including but not limited to charge coupled devices (CCDs), photosensors, or any other suitable device.

Organic Photovoltaic Cell Overview

FIGS. 1A, 2, 3, and 4 depict different examples of various layers of an OPV device.

FIG. 1A depicts a cross-sectional view of an exemplary organic photovoltaic (OPV) device having a channel layer. Due to the presence of the channel layer, the device generates current in response to photons incident on the areas between cathode/anode overlap (e.g., off the grid). This device may be illuminated from the transparent side or grid side, and the dimensions of the grid may vary from hundreds of microns to centimeters in pitch spacing. The increased charge carrier density at the collection area (electrode overlap) may increase the OPV voltage, increasing its power conversion efficiency.

Figure 2:
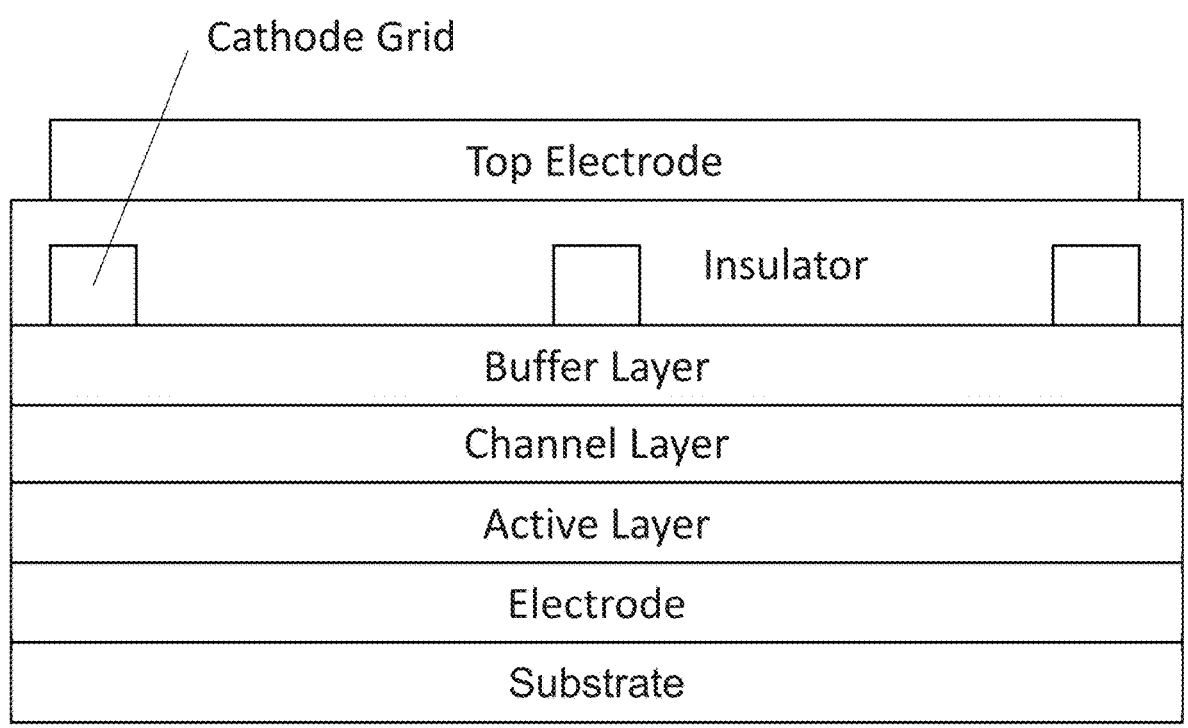
FIG. 2 depicts a variation of an OPV device having a channel layer in which there is broad coverage electrode insulated from the device over the grid electrode. In this example, the charge generation efficiency in regions away from the electrode overlap is modulated by an electric field which may be controlled via the bias voltage between the top electrode and the anode. The electrodes may be transparent or not.

FIG. 2 depicts a variation of an OPV device having a channel layer in which there is broad coverage electrode insulated from the device over the grid electrode. In this example, the charge generation efficiency in regions away from the electrode overlap is modulated by an electric field which may be controlled via the bias voltage between the top electrode and the anode. The electrodes may be transparent or not.

Figure 3:
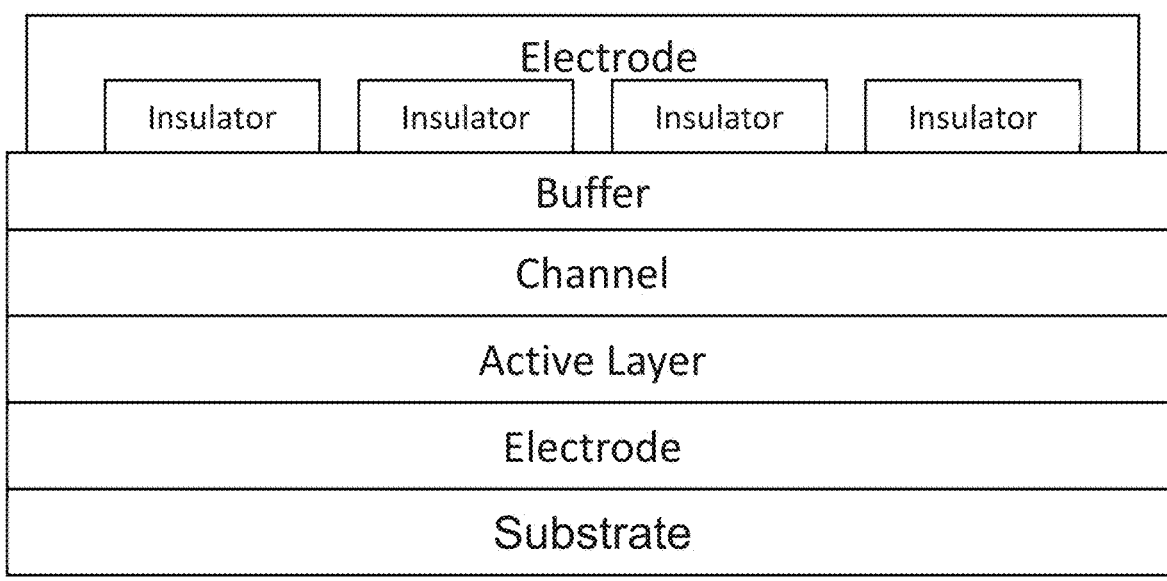
FIG. 3 depicts a variation of an OPV device in which a top electrode is in contact with the collecting grid.

FIG. 3 depicts a variation of an OPV device in which a top electrode is in contact with the collecting grid.

Figure 4:
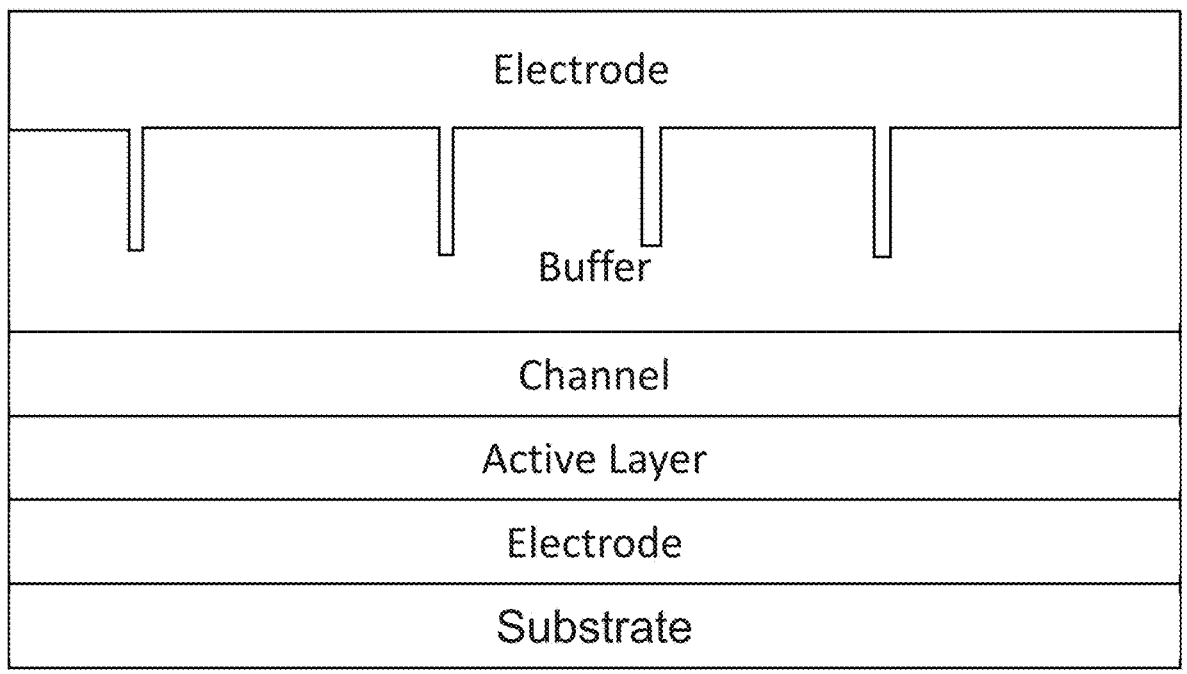
FIG. 4 depicts a variation of an OPV device in which a thick buffer material serves as an insulating layer.

FIG. 4 depicts a variation of an OPV device in which a thick buffer material serves as an insulating layer.

The various layers depicted in these figures will be described in greater detail with reference to FIG. 1A. In FIG. 1A, the OPV device 100 may include an OPV cell having two electrodes 102, 104 (e.g., an anode and a cathode) in superposed relation, at least one donor composition, and at least one acceptor composition, wherein the donor-acceptor material (e.g., heterojunction) or active layer 106 is positioned between the two electrodes 102, 104. At least one buffer layer 108 may be positioned between the first electrode 102 and the active layer 106. Additionally, or alternatively, at least one buffer layer 108, 110 may be positioned between the active layer 106 and the electrode 102, 104. Further, a channel layer 112 may be positioned between the active layer 106 and one of the electrodes (e.g., the second electrode 104).

As depicted in FIG. 1A, an electrode or outer layer (e.g., the first electrode 102) of the OPV cell may be positioned on a substrate 114 (e.g., glass).

Non-limiting examples of the various compositions of the various layers of the OPVs are described herein.

First Electrode (e.g., Anode)

In certain examples, the first electrode 102 positioned adjacent to a substrate may be the anode 102. While the examples further disclosed within this disclosure refer to the first electrode 102 as the anode (the alternative may apply, wherein the first electrode is the cathode).

The anode 102 may include a conducting oxide, thin metal layer, or conducting polymer. In some examples, the anode 102 includes a (e.g., transparent) conductive metal oxide such as indium tin oxide (ITO), tin oxide (TO), gallium indium tin oxide (GITO), zinc oxide (ZO), or zinc indium tin oxide (ZITO). In other examples, the anode 102 includes a thin metal layer, wherein the metal is selected from the group consisting of Ag, Au, Pd, Pt, Ti, V, Zn, Sn, Al, Co, Ni, Cu, Cr, or combinations thereof. In yet other examples, the anode 102 includes a (e.g., transparent) conductive polymer such as polyanaline (PANI), or 3,4-polyethyl-enedioxythiophene:polystyrenesulfonate (PEDOT:PSS).

The thickness of the anode 102 may be 0.1-1000 nm, 1-10 nm, 0.1-10 nm, 10-100 nm, or 100-1000 nm.

In some examples, an anti-reflective coating (ARC) may be positioned on an exterior surface of the anode 102. This may be advantageous in further improving the power conversion efficiency (PCE) of the solar cell. In some examples, the PCE may be improved by 1-10% or about 5% with the addition of the ARC.

The ARC may include a plurality of layers with alternating layers of contrasting refractive index. The plurality of layers of the ARC may include a first layer having magnesium fluoride and a second layer having silicon oxide. In some examples, the ARC has a thickness in a range of 1-1000 nm, 10-500 nm, 100-500 nm, or 100-200 nm.

Second Electrode (e.g., Cathode Grid)

The second electrode or cathode 104 may be a conducting oxide, thin metal layer, or conducting polymer similar or different from the materials discussed above for the anode 102. In certain examples, the cathode 104 may include a metal or metal alloy. The cathode 104 may include Ca, Al, Mg, Ti, W, Ag, Au, or another appropriate metal, or an alloy thereof.

The thickness of the cathode 104 may be 0.1-1000 nm, 1-10 nm, 0.1-10 nm, 10-100 nm, or 100-1000 nm.

In some examples, an anti-reflective coating (such as described above for the anode) may be positioned on an exterior surface of the cathode 104.

In certain examples, the second electrode or cathode 104 is arranged in a grid structure having a plurality of electrode segments (e.g., metal fingers) and a respective opening between adjacent segments of the electrode. This sparse (e.g., metal) grid arrangement or thin metal finger arrangement may be advantageous in improving the overall transparency of the OPV cell, based on the openings between the segments. In certain examples, the segments of the electrode make up less than 50%, less than 25%, less than 20%, less than 10%, less than 5%, or less than 1% of the overall surface area of the electrode (as viewed in a direction perpendicular to the electrode layer), while the remaining surface area is a transparent opening (e.g., without any composition or material in the electrode layer).

Figure 1B:
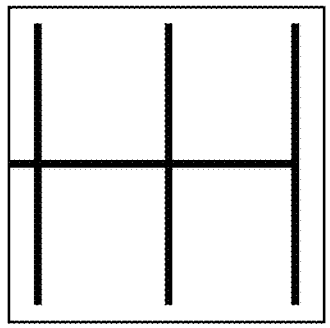
FIGS. 1B-1D depict different examples of a grid arrangement for the electrode (e.g. cathode) of an OPV device, such as represented in FIG. 1A (as viewed in a top-down direction of the OPV device).
Figure 1C:
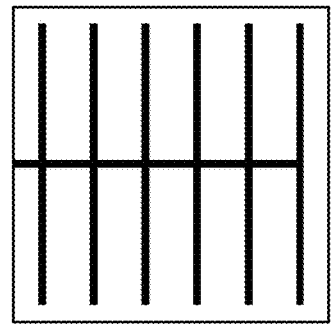
Figure 1D:
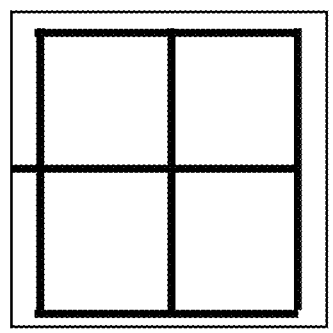

FIGS. 1B-1D depict different examples of a grid arrangement for the electrode (e.g. cathode) of the OPV device, such as represented in FIG. 1A (as viewed in a top-down direction of the OPV device). In FIG. 1B, three electrode segments or thin metal fingers are positioned along a first axis, separated from one another. The distance between each segment may be variable. FIG. 1B also depicts one electrode segment positioned along a second axis, perpendicular to the first axis.

FIGS. 1C and 1D represent further examples having a different arrangement of electrode segments positioned along the first and second axes. Further configurations are also possible (such as, e.g., an electrode segment not positioned along either of the axes).

Figure 1E:
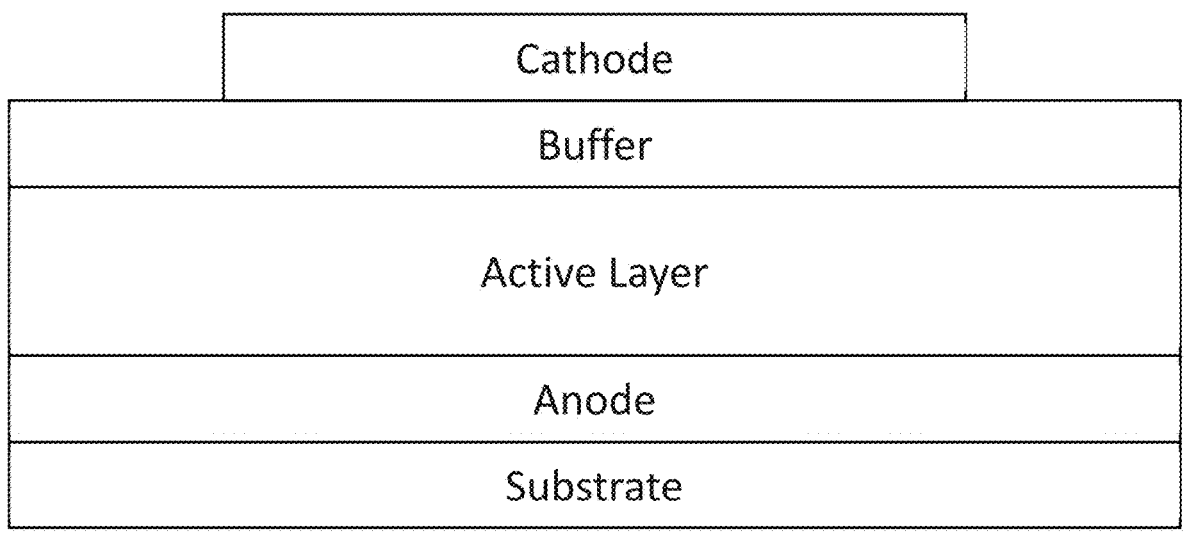
FIG. 1E depicts an OPV device without a grid arrangement for an electrode and without a channel layer.

In combination with the channel layer, discussed in greater detail below, the sparse electrode layer may advantageously provide a higher operating voltage than a conventional organic photovoltaic cell (such as depicted in FIG. 1E) that has two conventional electrode arrangements and no channel layer. The higher operating voltage of the OPV device, such as depicted in FIGS. 1A-1D may be due to the concentration of a large current to the sparse electrodes. Such an effect can be derived from the Shockley ideal diode equation:

$$I = I_D \left[ \exp\left(\frac{V_D}{k_B T}\right) - 1 \right] - I_{photo} \qquad (1)$$

In Equation (1), I is the overall current flowing in the device, $I_D$ is the diode reverse bias saturation current, $V_D$ is the voltage applied to the diode, $k_B$ is Boltzmann's constant, T is temperature, and $I_{photo}$ is the photocurrent generated by the device under illumination. Under open-circuit conditions, where I=0 this equation yields:

$$0 = I_D\left[\exp\left(\frac{V_{OC}}{k_B T}\right) - 1\right] - J_{photo} \quad (2)$$

In Equation (2), $V_{oc}$ is the open-circuit voltage. Rearranging, it can be shown that:

$$V_{OC} = k_B \cdot T \cdot \ln\left(\frac{I_{photo}}{I_D}\right) + 1 \quad (3)$$

Thus, the structures shown in FIGS. 1A-1D, 2, 3, and 4 have an increased current density collected locally at the contacts, an increased open-circuit voltage is expected.

Long-range electron diffusion in organic channels is demonstrated using the experimental setup disclosed below (and depicted in FIGS. 5A-5D), where light is incident through an optical fiber onto the organic device at a position, L, from the edge of the collecting cathode at time, t=-0, and the resulting current collected at the cathode is measured as a function of time using a current amplifier and oscilloscope. The resulting current in response to steady-state illumination at position, L, is shown in FIG. 5B, while the currents resulting from a short light pulse at position, L, are shown in FIG. 5C. A simple charge diffusion model is fit to the data as shown in FIG. 5D, verifying that the current results from diffusive charge transport.

Importantly, the device may be highly transparent and also highly efficient because the collecting area does not necessarily have a metal contact covering its entire surface as do most conventional OPVs (such as depicted in FIG. 1E).

Buffer Layers

As noted above, the OPV may include one or more charge collecting/transporting buffer or electron blocking layers 108, 110 positioned between an electrode 102, 104 and the active region or layer 106. The buffer layer(s) is/are advantageous in protecting the adjacently positioned layers or compositions from adversely interacting with each other. Additionally, certain compositions within the buffer layer may be advantageous in further improving the power conversion efficiency (PCE) of the OPV or solar cell.

The first and second buffer layers 108, 110 may individually be a metal oxide. In certain examples, the first and second buffer layers 108, 110 may individually include one or more of $MoO_3$, $V_2O_5$, ZnO, or $TiO_2$. In some examples, the first buffer layer 108 has a similar composition as the second buffer layer 110. In other examples, the first and second buffer layers 108, 110 have different compositions.

The first and/or second buffer layers 108, 110 may include vacuum-deposited electron transporting compositions or molecules.

In some examples, the first and/or second buffer layers 108, 110 are selected from the group consisting of:

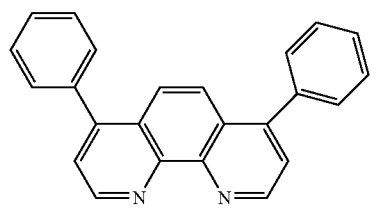

1

-continued

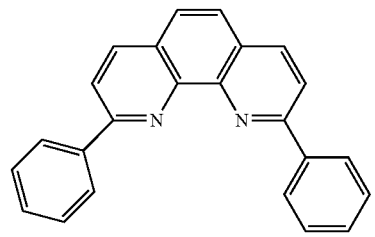

2

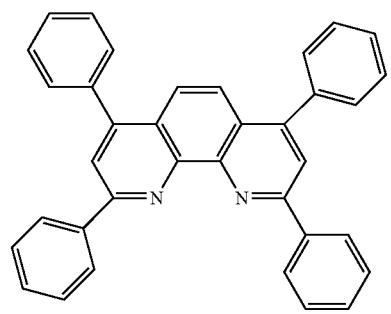

3

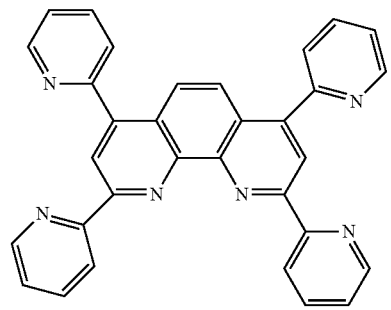

4

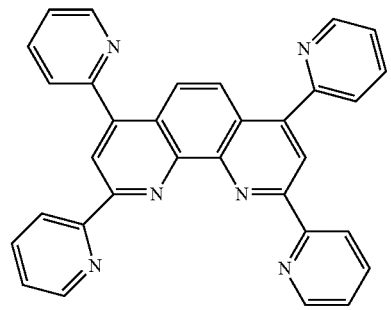

5

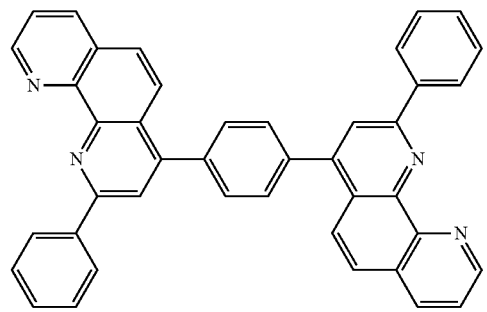

6

-continued

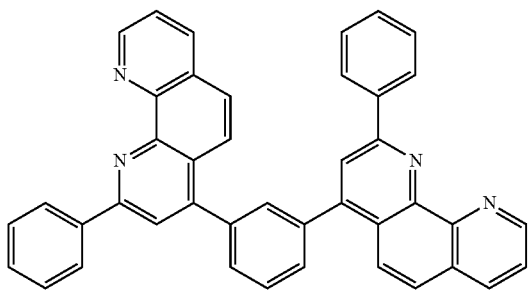
7

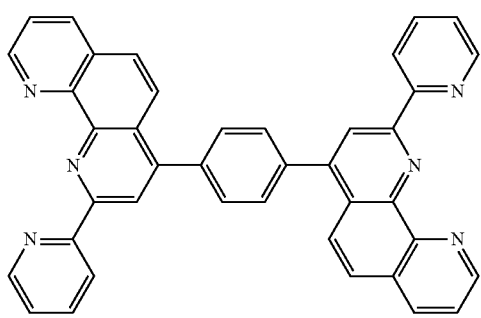
8

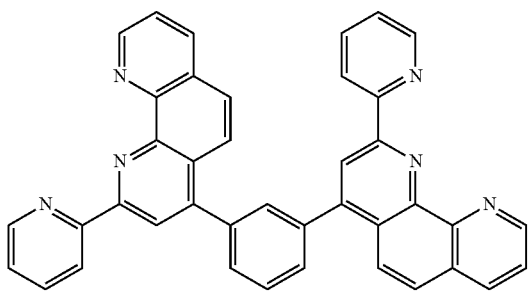
9

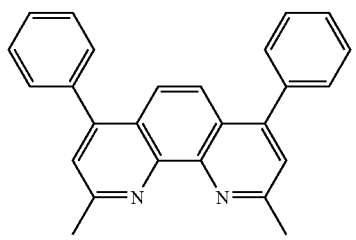
10

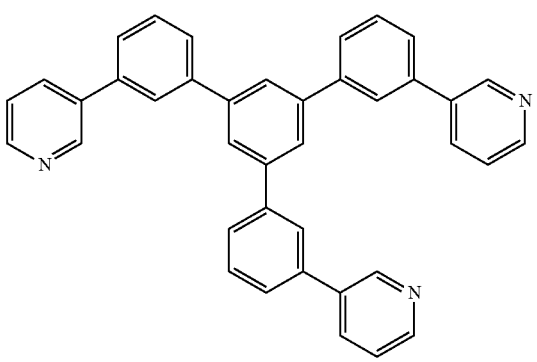
11

-continued

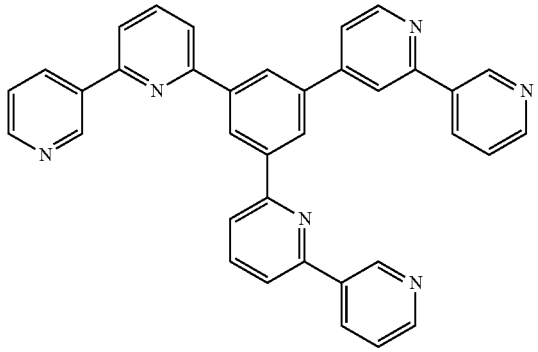
12

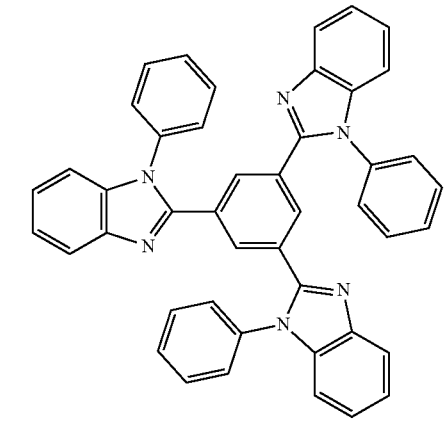
13

In certain examples, the first and/or second buffer layers 108, 110 include one or more of the following: 3,3',5,5'-Tetra[(m-pyridyl)-phen-3-yl]biphenyl; 1,3-Bis[3,5-di(pyridin-3-yl)phenyl]benzene; 1,3,5-Tri(p-pyrid-3-yl-phenyl)benzene; or 2,4,6-Tris(3'-(pyridin-3-yl)biphenyl-3-yl)-1,3,5-triazine.

In one particular example, the first and/or second buffer layer 108, 110 includes 4,7-Diphenyl-1,10-phenanthroline (i.e., bathophenanthroline or "BPhen") or a mixture of BPhen and a fullerene composition (e.g., $C_{60}$). In some examples, the mixed electron blockers or buffer layer may include a 1:1 volume ratio BPhen:$C_{60}$ (e.g., with BPhen adjacent to the electrode).

The thickness of each buffer layer 108, 110 may be 0.1-100 nm, 0.1-50 nm, 1-10 nm, 0.1-10 nm, or 10-100 nm.

Active Layer

As noted above, at least one active layer 106 or organic heterojunction layer is present between the two electrodes 102, 104. The thickness of the active layer is variable. In certain examples, the thickness of the active layer 106 may be less than 100 nm, or in a range of 10-100 nm, 50-100 nm, or 60-90 nm.

The active region or layer 106 positioned between the electrodes includes a composition or molecule having an acceptor and a donor. The composition may be arranged as an acceptor-donor-acceptor (A-D-A) or donor-acceptor-acceptor (d-a-a'). The compositions of the active layer or organic heterojunction may be selected to allow for lateral disperse a charge across the layer. In one embodiment, the active layer comprises an acceptor and a highly dipolar donor which destabilizes the HOMO energy of the acceptor, thereby providing energetic confinement of electrons in the channel layer.

Various examples of donor and acceptor compositions for each individual active layer are discussed in greater detail below.

Donor Composition of Active Layer

In certain examples, the donor material or composition within the active layer or region 106 may be a polymer composition such as a low energy band gap polymer composition. For example, the donor composition may be a polymer having a band gap of less than 2 eV.

One non-limiting example of a donor material or composition is poly[4,8-bis(5-(2-ethylhexyl)thiophen-2-yl)benzo[1,2-b:4,5-b']dithiophene-co-3-fluorothieno[3,4-b]thio-phene-2-carboxylate, or a derivative thereof. Another example of a low band gap polymer donor is poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] (herein referred to as "PCE-10"), or a derivative thereof.

In another example, the donor is 2-[(7-{4-[N,N-Bis(4-methylphenyl)amino]phenyl}-2,1,3-benzothiadiazol-4-yl)methylene]propanedinitrile (herein referred to as "DTDCPB"), or a derivative thereof.

In another example, the donor includes 2-((7-(5-(dip-tolylamino)thiophen-2l)benzo[c][1,2,5]thiadiazol-4-yl)methylene) malononitrile (herein referred to as "DTDCTB").

Other non-limiting examples of low band gap polymer donors include the compounds depicted below in P1-P9, and their derivatives:

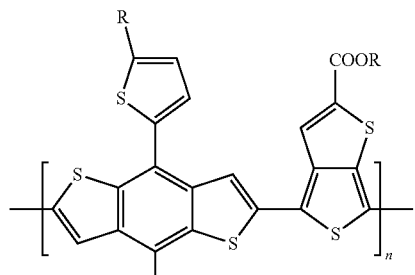

P1

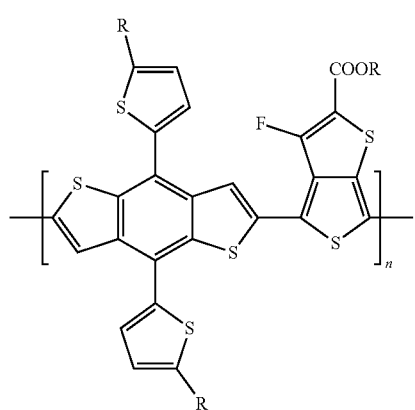

P2

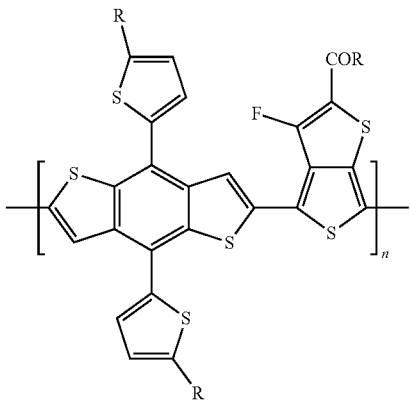

P3

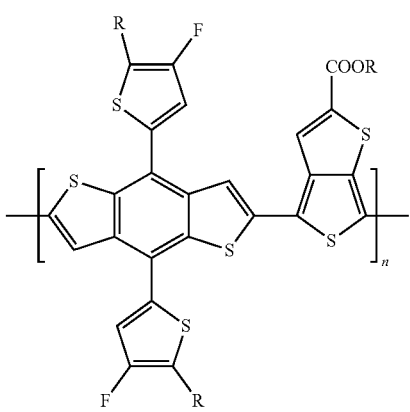

P4

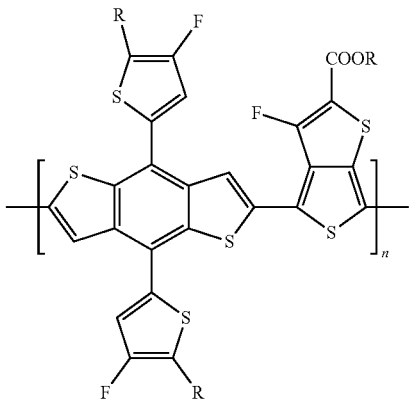

P5

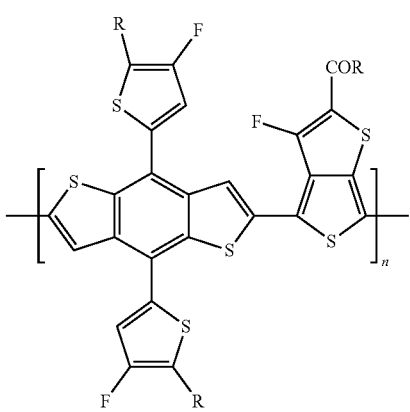

P6

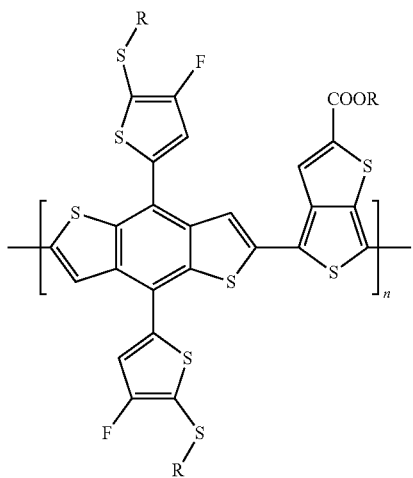

P7

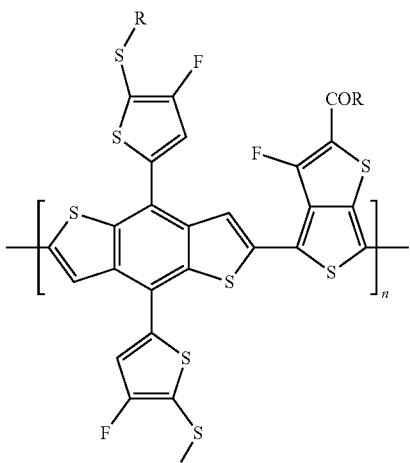

P9

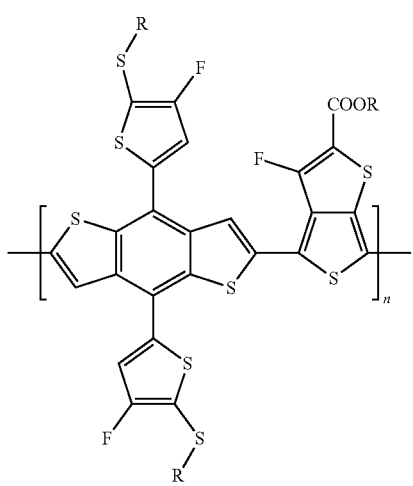

P8

In the polymers depicted in P1-P9, n refers to the degree of polymerization. In some examples, n is within a range of 1-1000, 1-100, or 10-1000.

Additionally, R may represent a linear or branched saturated or unsaturated non-aromatic hydrocarbon, e.g., within the $C_2$-$C_{20}$ range. In certain examples, R represents a saturated hydrocarbon or alkyl group. Examples of linear or branched alkyl groups in the $C_2$-$C_{20}$ range include methyl, ethyl, n-propyl, isopropyl, isobutyl, n-butyl, sec-butyl, tert-butyl, isopentyl, n-pentyl, neopentyl, n-hexyl, and 2-ethylhexyl. In one particular example, R represents 2-ethylhexyl.

Acceptor Composition

The acceptor in the active layer 106 may be a fullerene or non-fullerene acceptor molecule or composition. A fullerene molecule includes a hollow sphere, ellipsoid, or tube shape. The fullerene acceptor may be a spherical $C_{20}$, or $C_{2n}$ molecule, wherein n is an integer within a range of 12-100, for example. In certain examples, the fullerene acceptor is $C_{60}$ or $C_{70}$, or a derivative thereof.

In one embodiment, the active layer comprises a highly dipolar donor and a fullerene acceptor wherein the donor destabilizes the HOMO energy of the fullerene, thereby providing energetic confinement of electrons in the channel. In one embodiment, the highly dipolar donor comprises DTDCTB or DTDCPB. In one embodiment, the fullerene acceptor comprises $C_{60}$ or $C_{70}$.

Alternatively, the acceptor is a non-fullerene molecule. In such an example, the structure of the acceptor composition does not form a hollow sphere, ellipsoid, or tube. Non-limiting examples of the non-fullerene acceptor include:

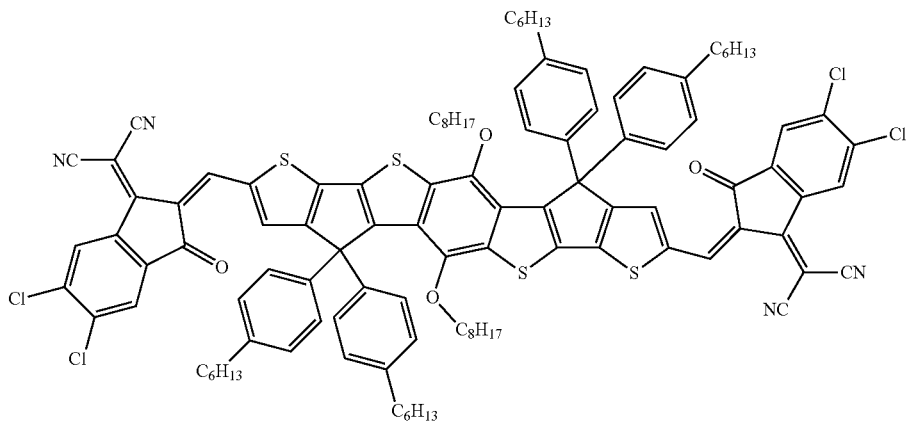

-continued
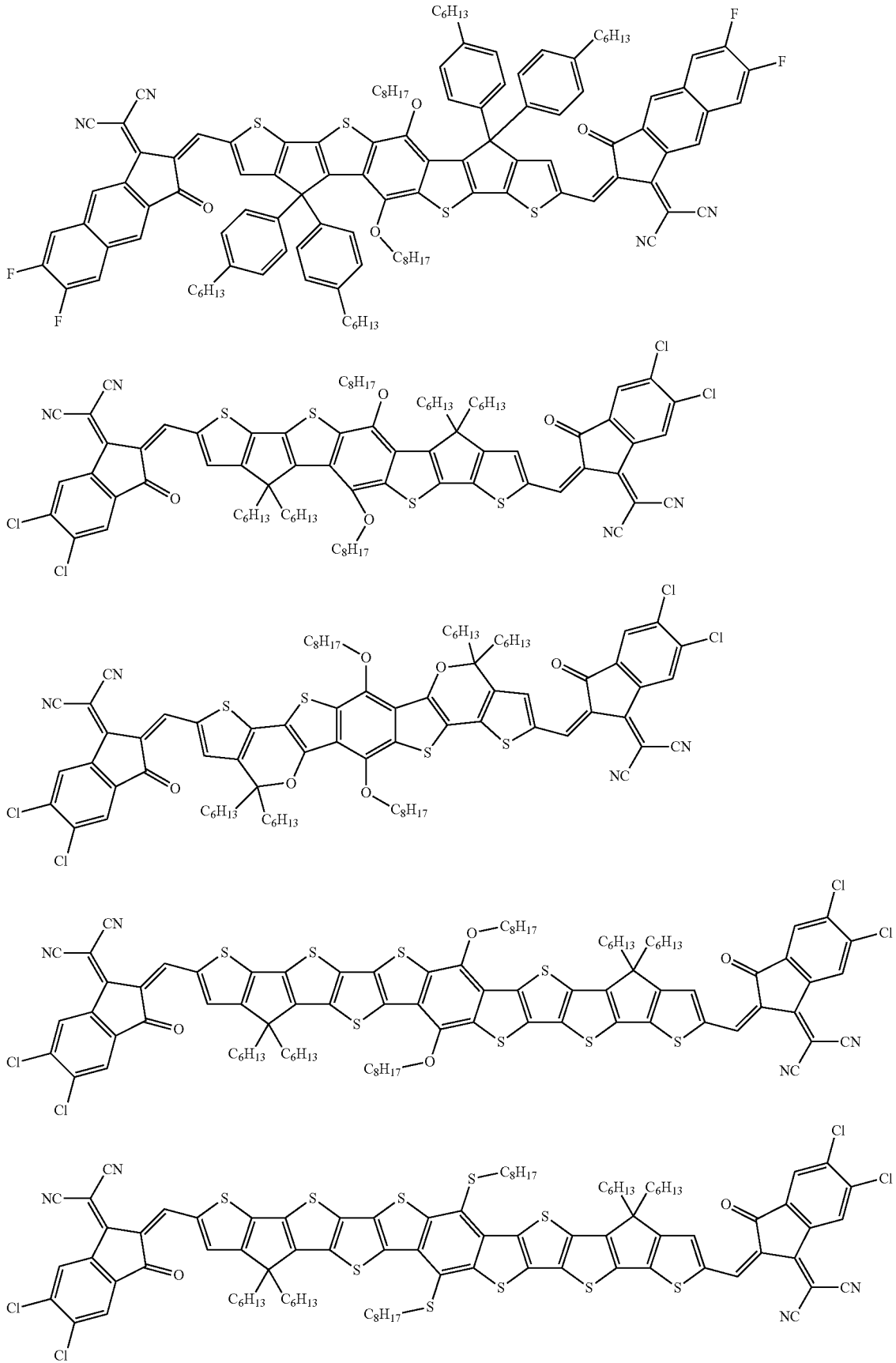

-continued

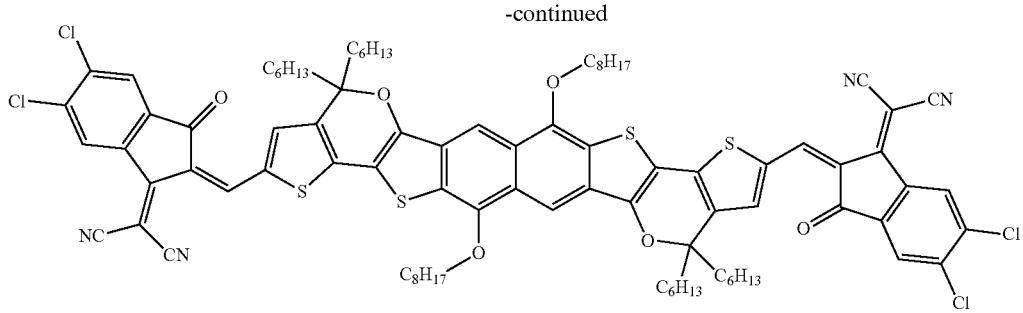

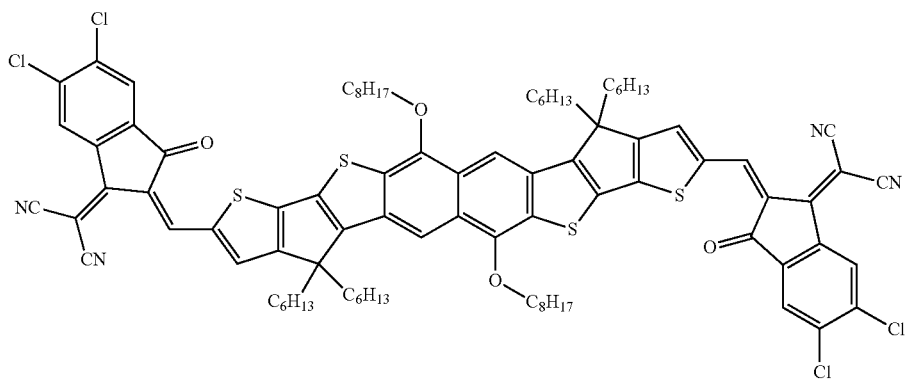

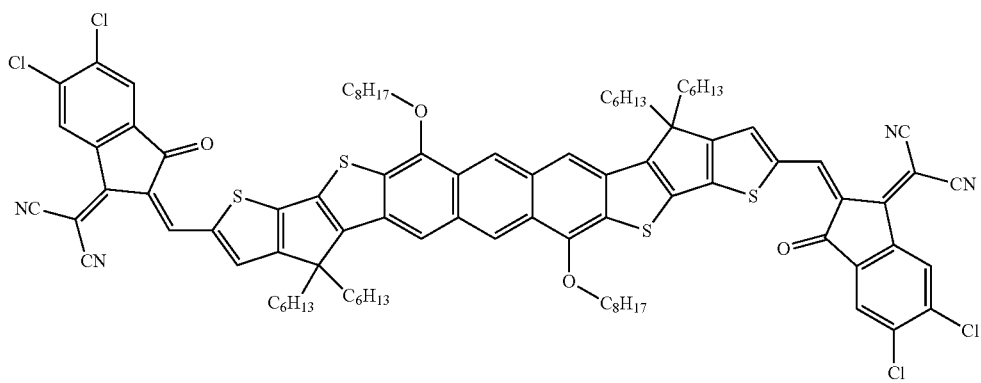

In one particular example, the non-fullerene acceptor is (4,4,10,10-tetrakis(4-hexylphenyl)-5,11-(2-ethylhexyloxy)-4,10-dihydro-dithienyl[1,2-b:4,5b']benzodi-thiophene-2,8-diyl)bis(2-(3-oxo-2,3-dihydroinden-1-ylidene)malononitrile) (herein referred to as "BT-IC"). BT-IC has planar structure with a small torsion angle<1° and consequently, a high electron mobility. However, the absorption of BT-IC does not extend to wavelengths λ>850 nm. This leaves an unused part of the solar spectrum and a potential opening for further improvement in solar cell performance.

In another example, the non-fullerene acceptor is (4,4,10,10-tetrakis(4-hexylphenyl)-5,11-(2-ethylhexyloxy)-4,10-dihydro-dithienyl[1,2-b:4,5b'] benzodi-thiophene-2,8-diyl) bis (2-(3-oxo-2,3-dihydroinden-5,6-dichloro-1-ylidene) malononitrile (depicted in the structure below, herein referred to as "BT-ClC"). This structure provides a narrow absorption band confined to the near-infrared spectrum through the introduction of high electron affinity halogen atoms (e.g., chlorine atoms).

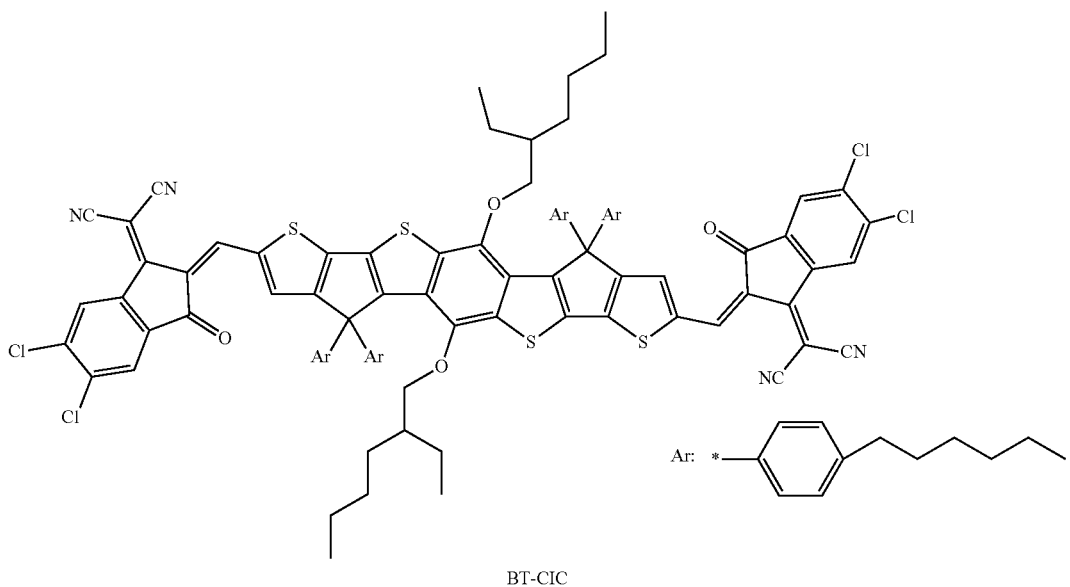

BT-CIC

In this example, four chlorine atoms are positioned in the 5,6-positions of the 2-(3-oxo-2,3-dihydroinden-1-ylidene)malononitrile. The design is advantageous as it avoids significant issues of previously reported in chlorinated molecules with non-specific atomic site positioning (and hence property variability).

Such non-fullerene acceptor compositions disclosed herein provide certain improved characteristics over conventional acceptor compositions. For example, the NFAs disclosed herein may provide an increased electron density for the donor molecule; a reduced electron density for the acceptor molecule, and an increased conjugation length of the A-D-A molecule.

The electron-withdrawing halogen (e.g., Cl) atoms effectively lower the energy gap by enhancing the intramolecular charge transfer and delocalization of π-electrons into the unoccupied, atomic 3d orbitals. Moreover, the intermolecular interactions of Cl—S and Cl—Cl result in ordered molecular stacks in the donor-acceptor blend films.

In certain examples, the length of the non-fullerene acceptor may be at least 20 angstroms, 25 angstroms, 30 angstroms, 35 angstroms, 40 angstroms, 50 angstroms, or between 20-50 angstroms, 25-40 angstroms, or 25-35 angstroms.

Channel Layer

As noted above, the OPV may include a channel layer 112 positioned between the active layer and an electrode (e.g., the electrode grid). In one embodiment, the OPV comprises a channel layer 112 positioned between the active layer and the buffer layer. In one embodiment, the OPV comprises a channel layer positioned between an electron blocking layer and a heterojunction (HJ). In one embodiment, the OPV comprises a channel layer positioned between an electron blocking layer and a blended donor:fullerene HJ that generates charge by dissociating excitons. In one embodiment, the blended donor:fullerene HJ comprises $C_{70}$. The blended donor:fullerene HJ may comprise any donor described elsewhere herein or known in the art. The channel layer 112 is configured to laterally disperse a charge across the channel layer, for example in a direction orthogonal to the thickness of the channel layer.

The channel layer 112 may include a composition having a high diffusivity/mobility, sufficient energy barrier (order of a few hundred meV) preventing charges from hopping into adjacent layers, energy levels that prevent the opposite charge carrier from hopping into the channel, as well as very low trap and defect densities in its bulk and at its interfaces. When these conditions are met, long range lateral transport is possible. This enables OPV devices using lateral transport layers.

In an embodiment wherein the channel layer is positioned between an active layer and a buffer layer, the energy barrier between the channel layer and the active layer confines electrons to the channel layer. In an embodiment wherein the channel layer is positioned between an electron blocking layer and a HJ, the energy barrier between the channel layer and the HJ confines electrons to the channel layer, spatially separating them from photogenerated holes in the HJ. In one embodiment, an energy barrier at the channel/HJ interface of between about 0.1 eV and about 5 eV confines electrons within the channel. In one embodiment, an energy barrier at the channel/HJ interface of between about 0.1 eV and about 4.5 eV confines electrons within the channel. In one embodiment, an energy barrier at the channel/HJ interface of between about 0.1 eV and about 4 eV confines electrons within the channel. In one embodiment, an energy barrier at the channel/HJ interface of between about 0.1 eV and about 3.5 eV confines electrons within the channel. In one embodiment, an energy barrier at the channel/HJ interface of between about 0.1 eV and about 3 eV confines electrons within the channel. In one embodiment, an energy barrier at the channel/HJ interface of between about 0.1 eV and about 2.5 eV confines electrons within the channel. In one embodiment, an energy barrier at the channel/HJ interface of between about 0.1 eV and about 2 eV confines electrons within the channel. In one embodiment, an energy barrier at the channel/HJ interface of between about 0.1 eV and about 1 eV confines electrons within the channel. In one embodiment, an energy barrier at the channel/HJ interface of between about 0.2 eV and about 0.7 eV confines electrons within the channel. In one embodiment, an energy barrier at the channel/HJ interface of about 0.42±0.1 eV confines electrons within the channel. As a result of this energetic confinement and exceptionally low trap densities within the channel and along its interfaces, centimeter-scale diffusion of electrons is observed in the channel.

In one embodiment, the charge diffusion length in an OPV comprising a fullerene channel is greater than about 1 cm. In one embodiment, the charge diffusion length in an OPV comprising a fullerene channel is greater than about 2 cm. In one embodiment, the charge diffusion length in an OPV comprising a fullerene channel is greater than about 3 cm. In one embodiment, the charge diffusion length in an OPV comprising a fullerene channel is greater than about 3.5 cm. In one embodiment, the charge diffusion length in an OPV comprising a fullerene channel is greater than the device length.

In one embodiment, an OPV comprising a fullerene channel has a room temperature (RT) charge diffusivity of between about 0.05 $cm^2s^{-1}$ and about 10 $cm^2s^{-1}$. In one embodiment, an OPV comprising a fullerene channel has an RT charge diffusivity of between about 0.05 $cm^2s^{-1}$ and about 9 $cm^2s^{-1}$. In one embodiment, an OPV comprising a fullerene channel has an RT charge diffusivity of between about 0.05 $cm^2s^{-1}$ and about 8 $cm^2s^{-1}$. In one embodiment, an OPV comprising a fullerene channel has an RT charge diffusivity of between about 0.05 $cm^2s^{-1}$ and about 7 $cm^2s^{-1}$. In one embodiment, an OPV comprising a fullerene channel has an RT charge diffusivity of between about 0.05 $cm^2s^{-1}$ and about 6 $cm^2s^{-1}$. In one embodiment, an OPV comprising a fullerene channel has an RT charge diffusivity of between about 0.05 $cm^2s^{-1}$ and about 5 $cm^2s^{-1}$. In one embodiment, an OPV comprising a fullerene channel has a charge diffusivity of between about 0.05 $cm^2s^{-1}$ and about 4 $cm^2s^{-1}$. In one embodiment, an OPV comprising a fullerene channel has an RT charge diffusivity of between about 0.05 $cm^2s^{-1}$ and about 3 $cm^2s^{-1}$. In one embodiment, an OPV comprising a fullerene channel has an RT charge diffusivity of between about 0.05 $cm^2s^{-1}$ and about 2 $cm^2s^{-1}$. In one embodiment, an OPV comprising a fullerene channel has an RT charge diffusivity of between about 0.05 $cm^2s^{-1}$ and about 1.5 $cm^2s^{-1}$. In one embodiment, an OPV comprising a fullerene channel has an RT charge diffusivity of between about 0.1 $cm^2s^{-1}$ and about 1.5 $cm^2s^{-1}$. In one embodiment, an OPV comprising a $C_{60}$ fullerene channel has an RT charge diffusivity of about 0.67±0.06 $cm^2s^{-1}$. In one embodiment, an OPV comprising a $C_{70}$ fullerene channel has an RT charge diffusivity of about 0.16±0.01 $cm^2s^{-1}$.

In one embodiment, the charge diffusivity of the device comprising a fullerene channel is thermally activated. In one embodiment, the activation energy is between about 5 meV and about 200 meV. In one embodiment, the activation energy is between about 5 meV and about 180 meV. In one embodiment, the activation energy is between about 5 meV and about 160 meV. In one embodiment, the activation energy is between about 5 meV and about 140 meV. In one embodiment, the activation energy is between about 5 meV and about 120 meV. In one embodiment, the activation energy is between about 5 meV and about 100 meV. In one embodiment, the activation energy is between about 5 meV and about 90 meV. In one embodiment, the activation energy is between about 15 meV and about 90 meV. In one embodiment, the activation energy is between about 25 meV and about 90 meV. In one embodiment, the activation energy of a device comprising a neat $C_{60}$ fullerene channel is about 70±8 meV. In one embodiment, the activation energy of a device comprising a neat $C_{70}$ fullerene channel is about 36±3 meV.

Due to the presence of the channel layer 112, the OPV device 100 may generate current in response to photons incident on the areas between cathode/anode overlap (e.g., off the grid). In one embodiment, an OPV device including the disclosed channel layer has a significant photocurrent response to light absorbed >1 cm beyond its collecting contact. In one embodiment, the device has a photocurrent response of at least 5% at a distance of 1 cm beyond its collecting contact. In other embodiments, the photocurrent response is at least 10%, at least 12%, or at least 15%. This device may be illuminated from the transparent side or grid side, and the dimensions of the grid may vary from hundreds of microns to centimeters in pitch spacing. The increased charge carrier density at the collection area (electrode overlap) may increase the OPV voltage, increasing its power conversion efficiency.

In some embodiments, an OPV as described herein may have an overall power conversion efficiency of at least 10%, at least 12%, at least 14%, at least 16%, or more. In some embodiments, an OPV including a channel layer as described herein may have an improvement in power conversion efficiency of between 1% and 200% over a comparable device without the disclosed structure. In other embodiments, an OPV including a channel layer as described herein may have an improvement in PCE of between 1% and 100%, between 1% and 50%, between 1% and 20%, or between 1% and 10%.

In certain examples, the channel layer 112 composition includes a fullerene composition, such as disclosed herein. The fullerene composition may comprise any fullerene known to a person of skill in the art. Exemplary fullerenes include, but are not limited to, $C_{60}$, $C_{70}$, $C_{60}$-SAM, $PC_{61}BM$, $WS-C_{60}$, $C_{60}$-ETA, PCBA, $C_{60}(OH)_{24-26}$, PCBB-2CN-2C8, ICMA, and combinations thereof. In some examples, the channel layer 112 composition is a neat fullerene composition. For example, the neat fullerene composition may be $C_{60}$ or $C_{70}$. In one embodiment, the channel layer composition is a mixed fullerene composition. In one embodiment, the mixed fullerene composition comprises two or more fullerene compounds. In one embodiment, the mixed fullerene composition comprises a fullerene compound mixed with a non-fullerene compound.

The channel layer 112 may have a thickness in a range of 0.1-100 nm, 1-100 nm, 50-100 nm, 1-50 nm, 10-50 nm or 25-75 nm. In one embodiment, the channel layer has a thickness of between about 1 nm and about 15 nm.

Substrate

As noted above, the OPV device 100 may include a substrate 114 positioned to support the OPV cell. In certain examples, such as depicted in FIG. 1A, the substrate 114 may be positioned adjacent to the first electrode 102. Alternatively, an intermediate layer (such as an anti-reflective coating layer) may be positioned between the electrode 102 and the substrate 114.

The substrate may be any material configured to support the OPV cell. In certain examples, the substrate 114 is a transparent material such as glass. In alternative examples, the substrate 114 may be a semi-transparent or opaque material.

OPV Performance Characteristics

In certain examples, the OPV or solar cell may have certain improved performance properties. For example, the solar cells disclosed herein may include an improved power conversion efficiency (PCE). In certain examples, the solar cell may have a PCE of at least 10%, at least 11%, at least 12%, at least 13%, at least 14%, or at least 15%. In some examples, the multi-junction solar cells disclosed herein have PCEs in a range of 10-15%, 12-15%, or 14-15%.

The solar cells disclosed herein may have a high open circuit voltage ($V_{oc}$). The $V_{oc}$ may be at least 1 V, at least 1.1 V, at least 1.2 V, at least 1.3 V, at least 1.4 V, at least 1.5 V, in a range of 1.5-2 V, in a range of 1.3-1.7 V, or in a range of 1.5-1.6 V.

The solar cells disclosed herein may have an improved fill factor (FF). The FF may be at least 50%, at least 60%, at least 65%, at least 70%, at least 75%, at least 80%, in a range of 50-80%, in a range of 60-80%, in a range of 65-75%, or approximately 70%.

The solar cells disclosed herein may have a high short circuit current ($J_{sc}$). The $J_{sc}$ may be in a range of 10-30 mA/cm$^2$, 10-15 mA/cm$^2$, or 12-13 mA/cm$^2$.

The solar cells disclosed herein may have an improved external quantum efficiency (EQE). The EQE may at least 50%, at least 60%, at least 65%, at least 70%, at least 75%, at least 80%, at least 85%, in a range of 65-85%, in a range of 65-75%, or approximately 70%, as measured between wavelengths of 500-850 nm and providing a transparency window between wavelengths of less than 600 nm that is filled by the visible-absorbing sub-cell in the tandem structure.

Experimental Examples

A series of devices was fabricated with the structure shown in FIG. 5A and described in the Methods (see below), with a device photograph shown in FIG. 5B. Devices are identified following the convention: (donor in the heterojunction)-(type and thickness of the neat fullerene channel)-(electron-blocking layer 'neat' or 'mixed'). Neat electron-blocking layers comprise only 8 nm of bathophenanthroline (BPhen), whereas the mixed electron blockers consist of 10 nm of 1:1 volume ratio BPhen:$C_{60}$, with 5 nm of BPhen on top. The devices share a common architecture with organic photovoltaic cells (OPVs) with a planar-mixed donor/acceptor (D/A) heterojunction, whose power conversion efficiencies are over 9%. Using the experimental set-up and device illustrated in FIG. 5A, the steady-state photocurrent response was measured of an OPV comprising the donor molecule 2-((7-(5-(dip-tolylamino)thiophen-21)benzo[c][1,2,5]thiadiazol-4-yl)methylene) malononitrile (DTDCTB) blended with $C_{60}$, as a function of the excitation position under approximately 0.15 mW cm-2 continuous illumination at a wavelength of 633 nm through the substrate from a fiber-coupled He—Ne laser. DTDCTB has a donor-acceptor-acceptor' (d-a-a') structure in which an electron-donating moiety and an electron-withdrawing moiety are bridged by another electron-accepting block. Results are shown in FIG. 5B.

In contrast to typical OPVs that exhibit no photo response to light incident outside the area of overlap of their anode and cathode, the DTDCTB-(10 nm $C_{60}$)-neat device generated a substantial photo response to such illumination. The magnitude of the steady-state photocurrent just outside the cathode was 40% of the peak within the device, decreasing approximately linearly to 12% at a distance L=10 mm away from the cathode edge, probably owing to recombination or trapping at the film edge where it contacted the encapsulation epoxy. The large drop in signal intensity at the edge of the cathode originates from a decrease in light absorption due to the lack of cathode reflection as well as a decrease in efficiency of charge generation and collection due to the lack of a built-in field outside the contact area. The photocurrent generated outside the contact overlap, henceforth called 'channel current', can cause overestimation of the short-circuit current in an OPV when it is overfilled by the illumination source. Devices with 2-[(7-(4-[N,N-bis(4-methylphenyl)amino]phenyl)-2,1,3-benzothiadiazol-4-yl) methylene] propane-dinitrile (DTDCPB) as the donor also exhibited channel currents, whereas those with boron sub-phthalocyanine chloride (SubPc) or tetraphenyldibenzoperiflanthene (DBP) as the donor had no response to light outside the cathode edge.

Figure 5A:
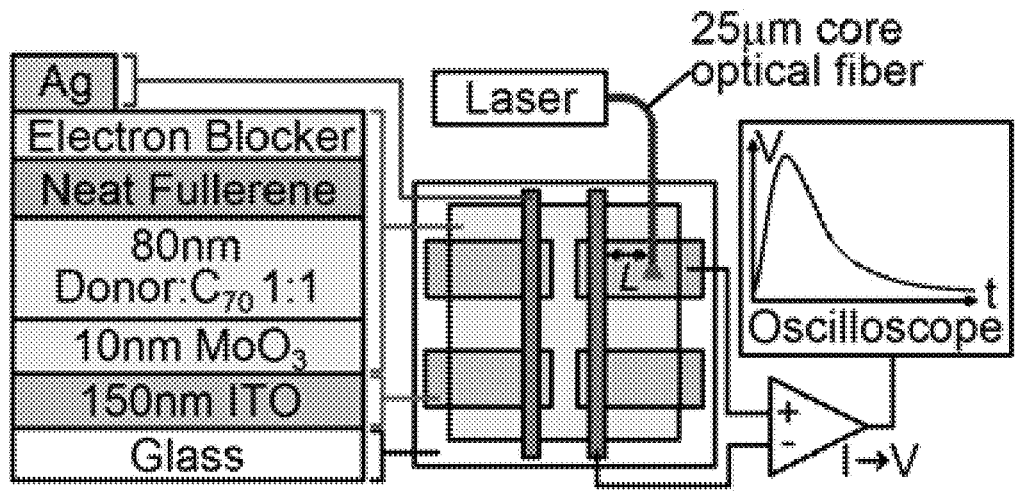
FIG. 5A depicts an example of an organic photovoltaic device structure (left) and schematic of the substrate design with experimental setup for transient photocurrent measurements (right), where L is the distance between the fiber illumination position and the edge of the silver cathode.
Figure 5B:
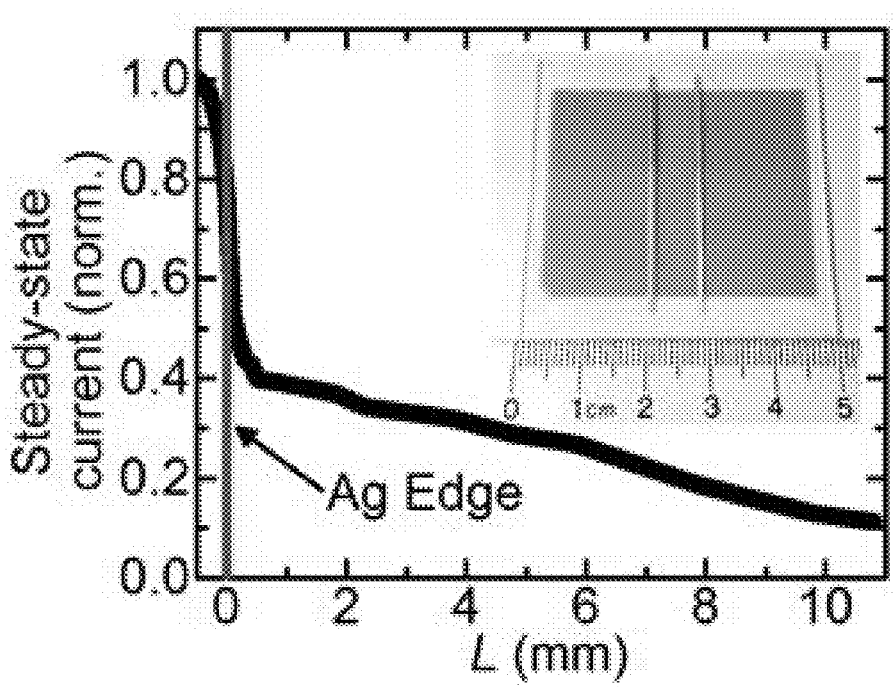
FIG. 5B depicts a normalized steady-state current of a DTDCPB-(10 nm $C_{60}$)-neat device due to constant 633 nm illumination at position L, and the inset is a photograph of the device of FIG. 5A prior to encapsulation.
Figure 5C:
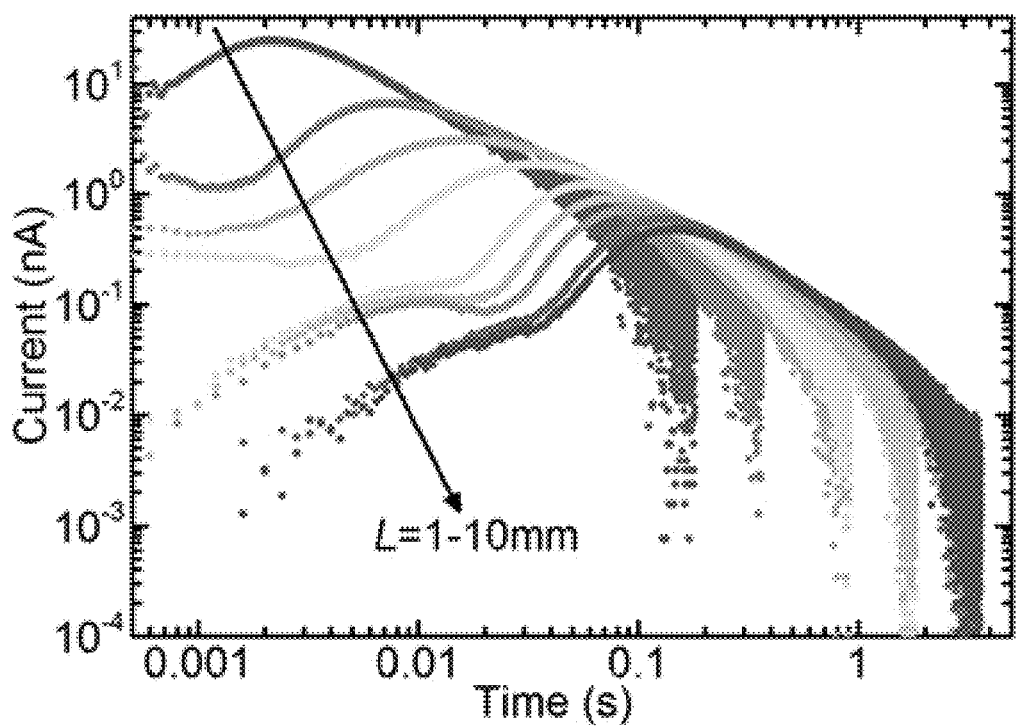
FIG. 5C depicts room temperature photocurrent transients of a DTDCPB-(10 nm $C_{60}$)-Neat device illuminated with 500 μs pulses at 405 nm wavelength for L=1-10 mm.
Figure 5D:
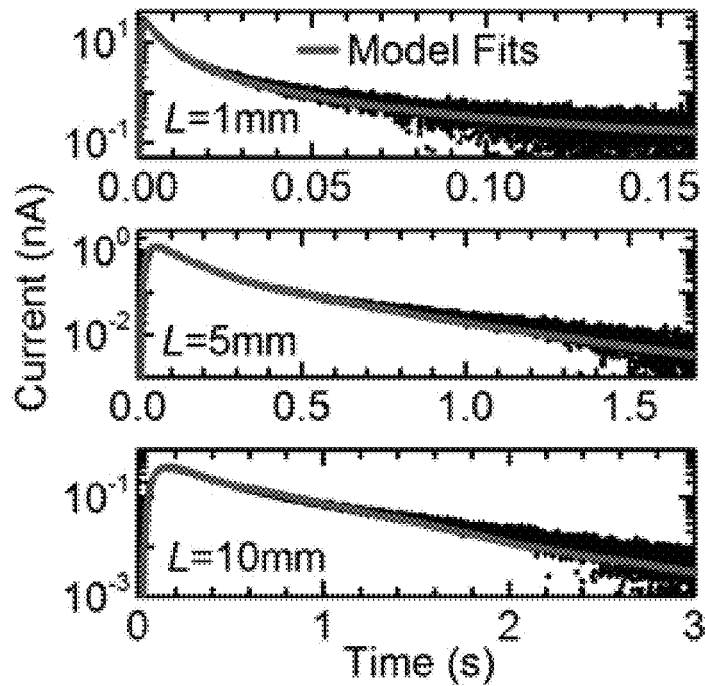
FIG. 5D depicts charge diffusion model simulations (lines) and corresponding transient photocurrent data (points) at L=1, 5, and 10 mm.

The transient behavior of channel currents in all device architectures was investigated using the experimental set-up in FIG. 5A, with 500 µs pulses of 405 nm wavelength light as the illumination source. FIG. 5C shows the transient channel current from the DTDCPB-(10 nm $C_{60}$)-neat device illuminated at L=1-10 mm. As L increased, the amplitude and arrival time of the channel current varied by nearly two orders of magnitude, although the standard deviation of the integrated charge collected for each transient was less than 10% of the mean for all transients. That is, no measurable loss was observed in the total number of charges collected, independent of the position of excitation, indicating that the charge-diffusion length $L_D$ in the structure is considerably greater than the device length of 1 cm. In devices with $C_{70}$ channels, the integrated signal decreased by 50% over 5 mm, suggesting that $L_D$ is small compared with that for $C_{60}$. The external quantum efficiency (EQE, the number of electrons collected per incident photon) decreased as a function of pump pulse energy and duration, presumably owing to increased recombination at higher polaron concentrations. In the DTDCTB-(10 nm $C_{60}$)-neat device at L=2 mm, the EQE decreased from 30% to 15% as the pump pulse energy increased from 0.11 nJ to 1.7 nJ at a wavelength of 637 nm, and EQE decreased by 72% as the pulse length was increased from 0.1 ms to 100 ms. The collection efficiency of channel currents was wavelength-independent: that is, it tracked the absorption spectrum of the blended heterojunction. Channel currents were observed only when illuminating the organic area above the indium tin oxide (ITO) anode, which was needed to collect the photogenerated holes, thus preventing sample charging and reducing recombination.

A simple charge-diffusion model described in the Methods (see below) was used to fit all transient currents as a function of L. Detailed transients (points) from FIG. 5C are plotted on a logarithmic-linear scale for the DTDCTB-(10 nm $C_{60}$)-neat device in FIG. 5D at L=1 mm, 5 mm, and 10 mm. The parameters extracted from the fits (lines) are given in Table 1. Among devices grown in the same batch, DTDCTB and DTDCPB devices with 10-nm-thick $C_{60}$ channel and neat electron-blocking layers had comparable diffusivities, which were reduced by replacing the $C_{60}$ with $C_{70}$, and by replacing the neat electron-blocking layer with a mixed layer. This reduction is presumably due to electron diffusion into the mixed layer where the diffusivity D is relatively low. Decreasing the $C_{60}$ channel thickness in the DTDCTB-$C_{60}$-neat devices from 10 nm to 2 nm also decreased D and the amount of total charge, Q, injected into the fullerene layer. The peak-to-peak roughness of the films grown on ITO is typically several nanometers as measured by atomic force microscopy; thus, the thin fullerene channels are likely to have discontinuities and thickness variations that disrupt electron diffusion in thinner channels. The upper bound for the rate of charge trapping and recombination, k, in $C_{70}$ was about five times as high as that in $C_{60}$ channels. There were batch-to-batch variations in D, k, and Q, but the relative performance between architectures was consistent; that is, devices with neat blockers or neat $C_{60}$ always had considerably higher D than devices with mixed blockers or $C_{70}$ grown in the same batch.

TABLE 1

Room temperature charge diffusion parameters extracted from distance-dependent transient current measurements

| Device | D (cm$^2$/s) | k (s$^{-1}$) | µ† (cm$^2$/V-s) | Q (nC) |
|---|---|---|---|---|
| DTDCPB - (10 nm $C_{60}$) - Neat | 0.83 ± 0.07 | 0.9 ± 0.6 | 32 ± 3 | 2.2 ± 0.8 |
| DTDCTB - (10 nm $C_{60}$) - Neat | 0.67 ± 0.06 | 1 ± 1 | 26 ± 2 | 0.38 ± 0.02 |
| DTDCTB - (5 nm $C_{60}$) - Neat | 0.53 ± 0.03 | 0.4 ± 0.4 | 20 ± 1 | 0.35 ± 0.02 |
| DTDCTB - (2 nm $C_{60}$) - Neat | 0.16 ± 0.02 | 0.7 ± 0.7 | 6 ± 1 | 0.29 ± 0.03 |
| DTDCTB - (10 nm $C_{60}$) - Mixed | 0.37 ± 0.08 | 0.3 ± 0.2 | 14 ± 3 | 3.2 ± 0.8 |
| DTDCTB - (10 nm $C_{70}$) - Neat | 0.16 ± 0.01 | 2.4 ± 0.8 | 6 ± 1 | 0.21 ± 0.02 |

†Estimated using the Einstein relation

Ultraviolet photoelectron spectra were measured for donor $C_{70}$ blends both with and without a cap of 5 nm $C_{60}$; see Methods. With the DTDCPB donor, a difference of 0.42±0.1 eV was observed between the highest occupied molecular orbital (HOMO) energy ($E_{HOMO}$) of the blended $C_{70}$ and neat $C_{60}$ cap, whereas the difference in $E_{HOMO}$ between neat $C_{60}$ and $C_{70}$ is about 0.1 eV. The difference in $E_{HOMO}$ between DBP:$C_{70}$ blends with and without a 5 nm $C_{60}$ cap was less than 100 meV, indicating that DBP does not noticeably shift $E_{HOMO}$ of $C_{70}$ when the two constituents are blended.

Figure 6A:
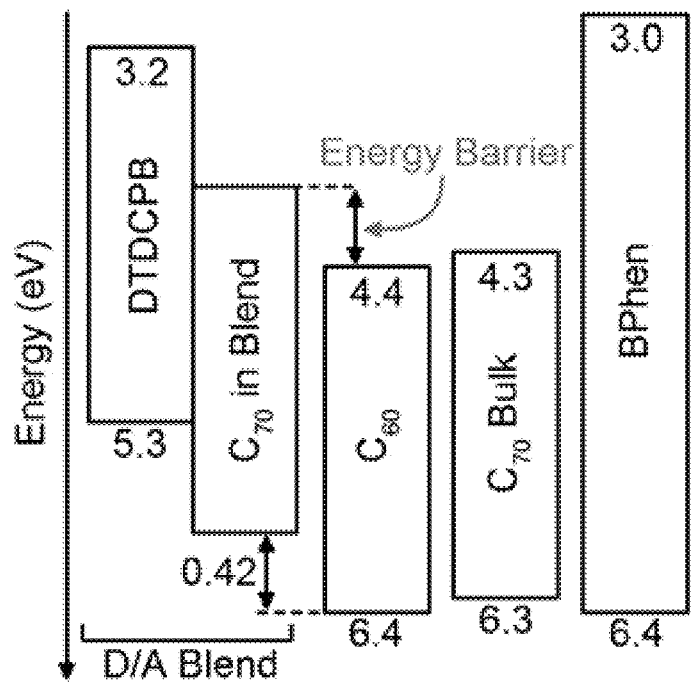
FIG. 6A depicts an energy level diagram extracted from ultraviolet photoelectron spectroscopy measurements on a 10 nm thick $C_{70}$ and a 10 nm thick DTDCPB:$C_{70}$ blended film with and without a 5 nm thick $C_{60}$ film grown on its surface.
Figure 6B:
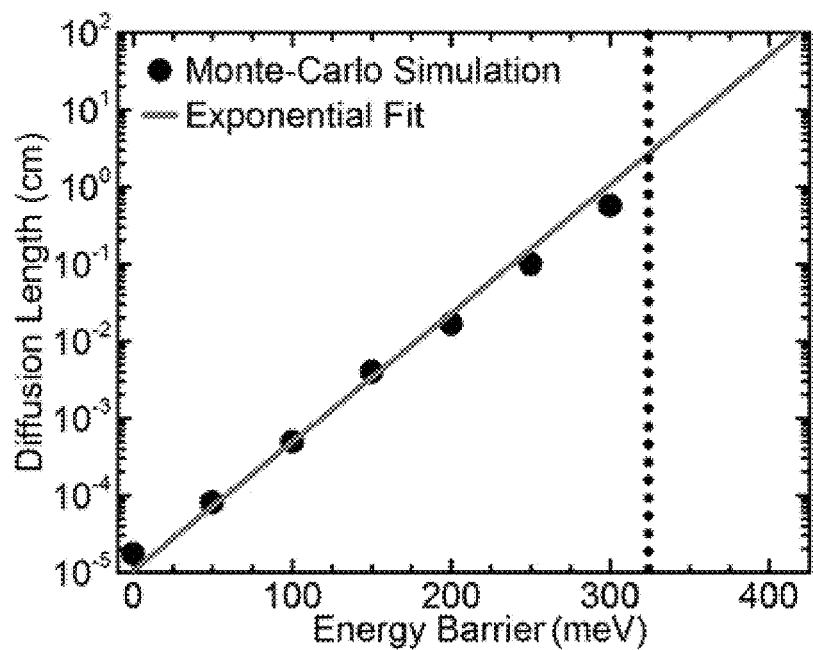
FIG. 6B depicts Monte Carlo simulations of the hopping diffusion length as a function of the energy barrier height for electrons between the neat channel layer and the donor-acceptor heterojunction. The dotted line indicates the lower bound of the energy barrier measured via ultraviolet photoelectron spectroscopy.

To quantify the impact of the energy barrier between the fullerene channel and heterojunction, Monte Carlo simulations of the carrier transport within the device structure were performed to calculate $L_D$ (see Methods), with results shown in FIG. 6B. $L_D$ was found to be thermally activated as a function of the barrier height, $E_B$, following $L_D$ (µm)= (0.1±0.03) exp($E_B/k_BT$), where $k_B$ is Boltzmann's constant and T is the temperature. The fit is indicated by the solid line in FIG. 6B. The pre-factor is the diffusion length at $E_B$=0. The lower bound of $L_D$ is 2.2 cm at 320 meV (dotted line, FIG. 6B), which corresponds to the lower bound of the measured energy barrier in the DTDCPB:$C_{70}$ film with a $C_{60}$ cap. The $L_D$ inferred from the measured $E_B$=0.42 eV is two orders of magnitude larger than this lower bound.

Figure 7A:
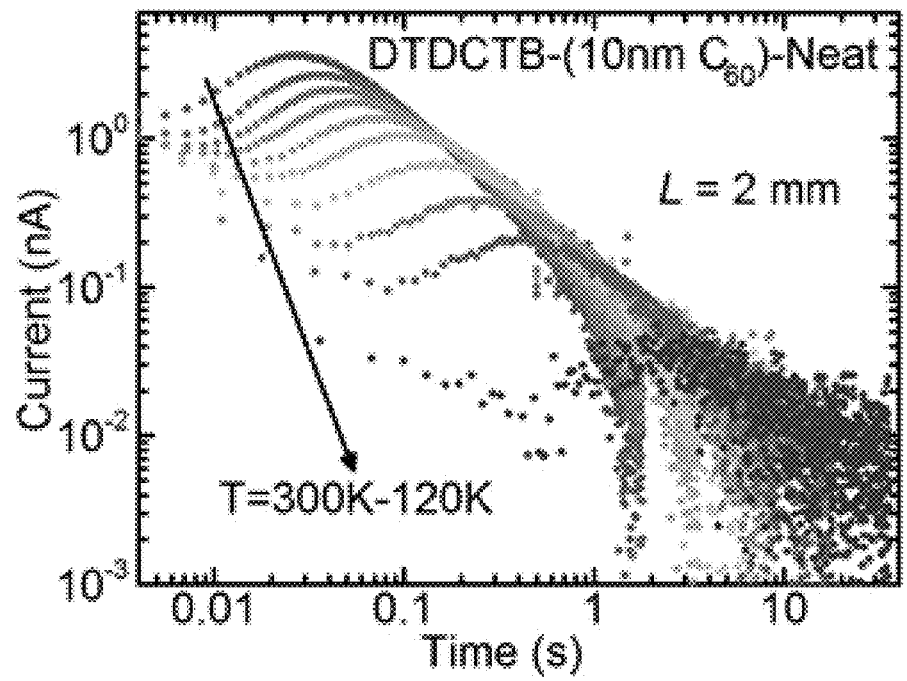
FIG. 7A depicts temperature dependent transient photocurrent data at 20K intervals from 300K to 120K in response to 2 ms pulses of 637 nm wavelength illumination on a DTDCTB-(10 nm $C_{60}$)-Neat device at L=2 mm.
Figure 7B:
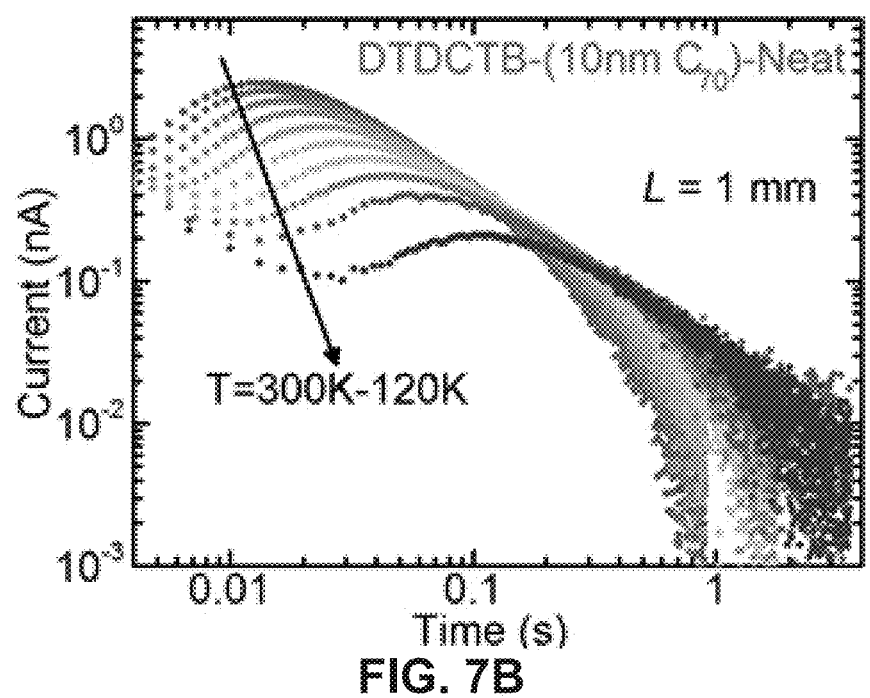
FIG. 7B depicts temperature dependent transient photocurrent data at 20K intervals from 300K to 120K in response to 2 ms pulses of 637 nm wavelength illumination on a DTDCTB-(10 nm $C_{70}$)-Neat device at L=1 mm.
Figure 7C:
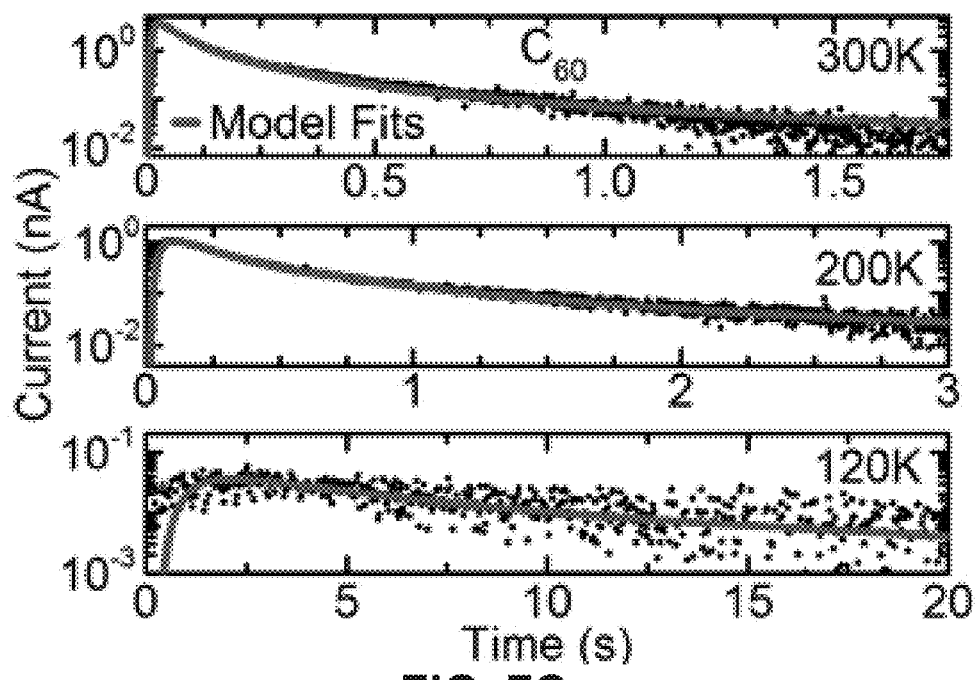
FIG. 7C depicts data (points) and corresponding charge diffusion model fits (lines) at 300K, 200K, and 120K for the DTDCTB-(10 nm $C_{60}$)-Neat device.
Figure 7D:
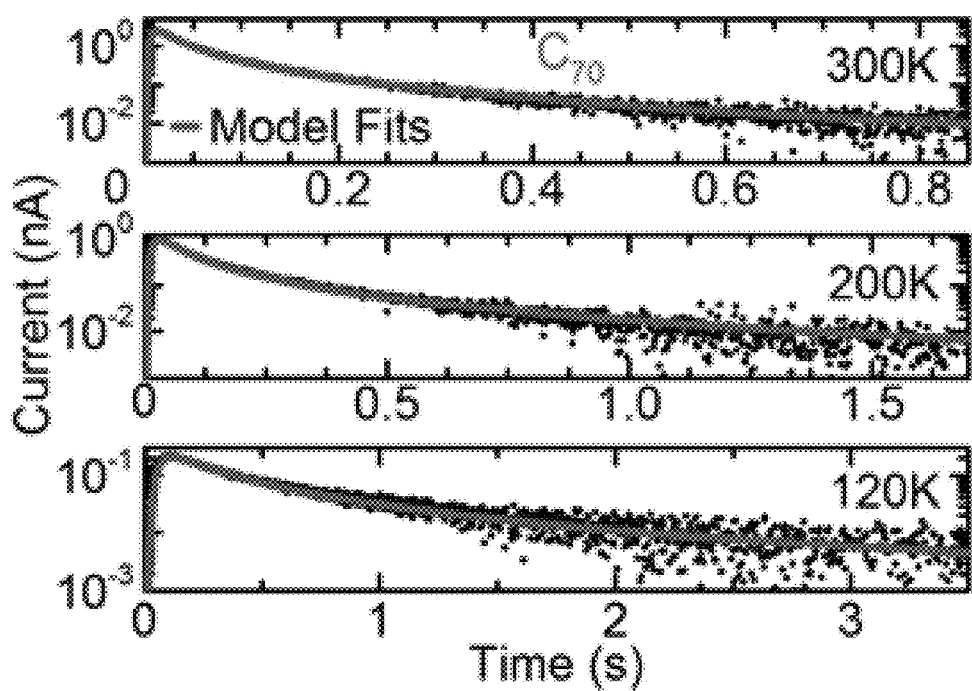
FIG. 7D depicts data (points) and corresponding charge diffusion model fits (lines) at 300K, 200K, and 120K for the DTDCTB-(10 nm $C_{70}$)-Neat device.

The temperature dependence of the current transients in DTDCTB-(10 nm $C_{60}$)-neat and DTDCTB-(10 nm $C_{70}$)-neat devices was obtained at 20 K intervals in the range 300 K≥T≥120 K. The results are shown in FIG. 7A and FIG. 7B at L=2 mm and L=1 mm, respectively. Each current transient was fitted using the charge-diffusion model as shown by solid lines in FIG. 7C and FIG. 7D, with the extracted values of D and k plotted against 1000/T in FIG. 7E and FIG. 7F.

The lifetime of electrons in the channel is determined by the rates of trapping and recombination at defects, and by thermionic emission into the heterojunction where recombination can occur. A sufficiently high heterojunction energy barrier and low defect densities are therefore required to enable transport over macroscopic distances. In devices with d-a-a' donors, the energy levels of $C_{70}$ undergo a polarization shift due to the high dipole moments of DTDCTB and DTDCPB (14.5 debye and 12.0 debye, respectively). This shift forms the required energy barrier at the $C_{60}$ channel/heterojunction interface (0.42±0.1 eV for DTDCPB, as shown in FIG. 6A) that confines electrons within the channel. Monte Carlo simulations confirm that this barrier supports centimeter-scale diffusion, whereas DBP or SubPc donor devices with barrier heights of less than 100 meV have a much smaller $L_D$<5 µm. The centimeter-scale $L_D$ observed in devices with d-a-a' donors suggests that, in addition to the large $E_B$, the channel and its interfaces have a remarkably low density of deep electron traps and recombination centers. This is surprising for fullerenes, which, despite their unusually high mobility and diffusivity among molecular solids, form disordered and phase-separated amorphous and crystalline domains.

Figure 8:
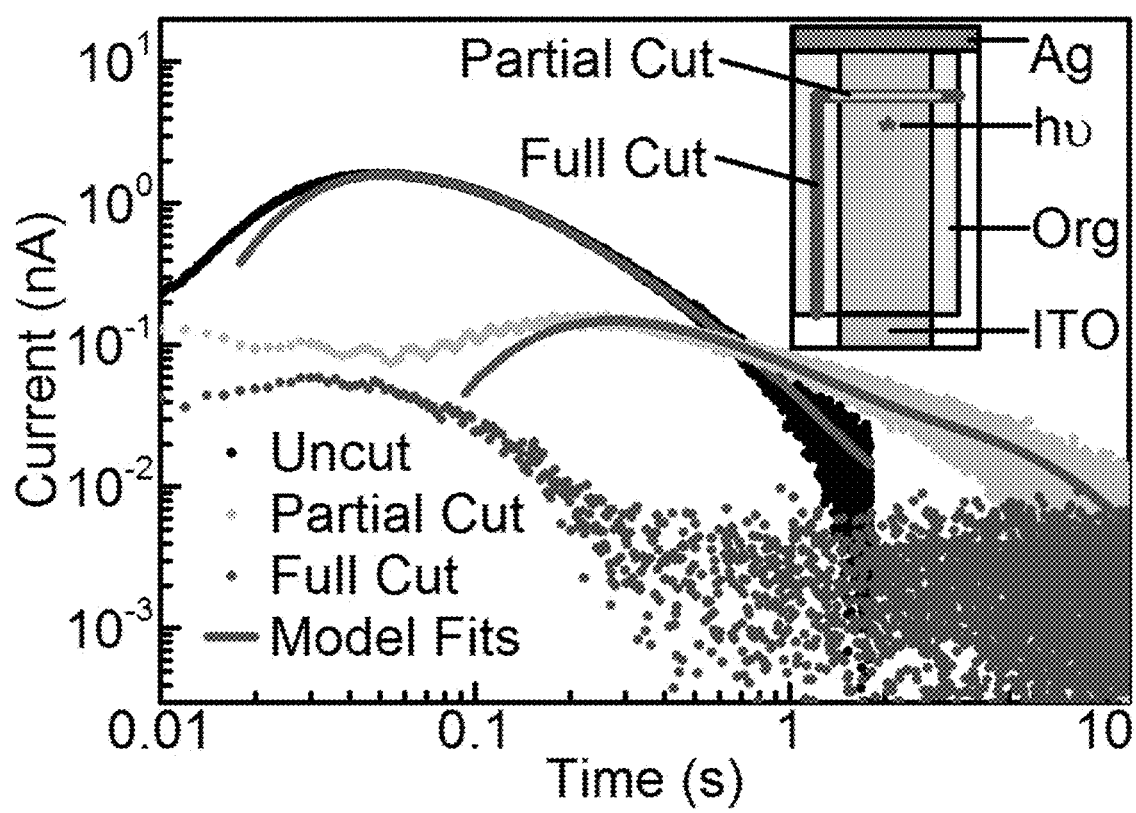
FIG. 8 depicts room temperature transient currents measured on a DTDCTB-(10 nm $C_{60}$)-Mixed device at L=3 mm before and after a series of razor blade cuts was made to the organic layers (as shown in the inset). The peak height of the current pulse was significantly reduced and the peak arrival time was delayed for devices with a "partial cut" that was transverse to, and spanned the width of the ITO anode between the illumination position and the silver cathode, compared with the pristine, uncut device. Charge diffusion simulations were performed for both geometries, where the only difference was a blocking boundary condition at the position of the partial cut. We find that charge diffusion around the cut accounts for the differences between the cut and uncut device transients, as demonstrated by the remarkable agreement between fits (lines) and the data. The partial cut was also extended such that there was no continuous organic path between the illumination position and the cathode, called a "full cut" device. This eliminated the response except for a residual current at time, t<200 ms arising from scattered light absorbed in the organic layers between the cathode and cut. This effect was observed in all devices exhibiting channel currents.
Figure 9A:
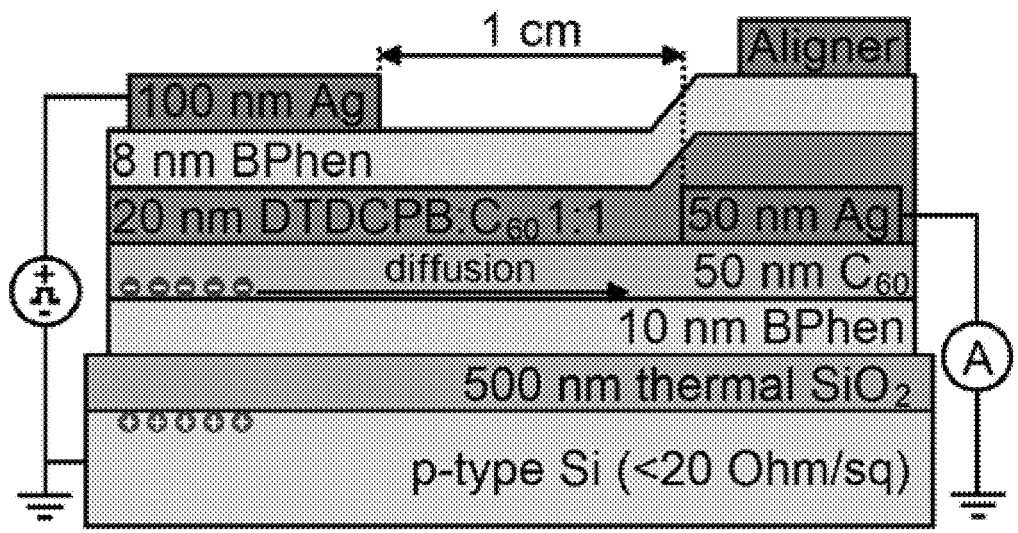
FIG. 9A depicts the structure of a fabricated device to characterize charge diffusion in an electron-only electrically injected channel.
Figure 9B:
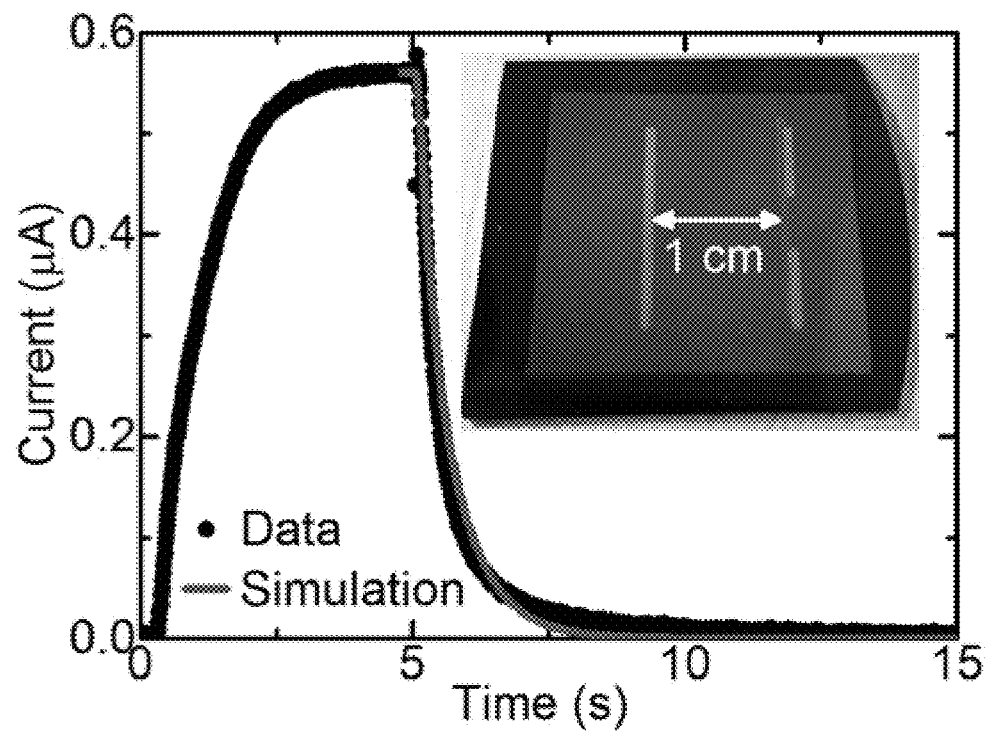
FIG. 9B depicts a transient current collected at a buried contact, based on charges injected into the $C_{60}$ channel by applying a 50 V pulse between the injecting contact and the Si substrate for 5 s. A steady state current of 0.56 μA is observed approximately 3 s after the start of the pulse, with an exponential decay time of about 400 ms. A simulation of the turn-off transient using the same optically measured parameters for D and k in Table 1 for the DTDCPB-(10 nm $C_{60}$)-Neat device, is also depicted in the figure (solid line). The small deviations of the fits to the electrical data are likely due to slow de-trapping of charges in the BPhen and $SiO_2$ that are injected during the 50 V pulse. (Inset: Photograph of the device with 1 cm scale bar.)

Long-range electron diffusion was also observed to circumvent barriers introduced by physically cutting through the channel (FIG. 8), as well as in an electron-only charge-injecting sample (FIGS. 9A-9B). Indeed, measurements of D and k in these experiments are completely consistent with values obtained through photogeneration in FIGS. 8, 9A, and 9B. Drift-dominated lateral spreading of charges over long time periods has been observed in unipolar devices at organic/insulator interfaces owing to the lack of recombination. The results presented here are inherently different because the electron transport in the conventional art is entirely diffusive, is associated with the bulk and is observed despite the presence of optically generated holes.

Replacing the 10 nm layer of $C_{60}$ with $C_{70}$ reduces D from 0.67±0.06 cm$^2$ s$^{-1}$ to 0.16±0.01 cm$^2$ s$^{-1}$ at room temperature. The Einstein relation, D=µ$k_B$T/q, where q is the electron charge and µ is mobility, suggests that the larger D observed in the $C_{60}$ devices is consistent with its higher mobility. This relation can also be used to estimate the electron mobility of each device, as listed in Table 1, although D/µ in some organic systems has been shown to be larger than that predicted by the Einstein relation, because of disorder in the conduction-site energies. The room-temperature mobilities, µ=26±3 cm$^2$V$^{-1}$s$^{-1}$ for $C_{60}$ and 6±1 cm$^2$V$^{-1}$s$^{-1}$ for $C_{70}$, were found to be 2-5 times higher than those reported previously for fullerenes in transistors. In general, mobilities in bulk semiconductors are larger than those at interfaces, owing to interfacial traps, and mobilities and diffusivities in disordered semiconductors typically increase with charge density because of the filling of shallow traps and low-energy states in the conduction-band tail. The devices measured here are therefore nearly ideal for achieving high mobility, as charge transport occurs in the bulk of the channel with electron densities of more than 10$^{17}$ cm$^{-3}$.

Figure 7E:
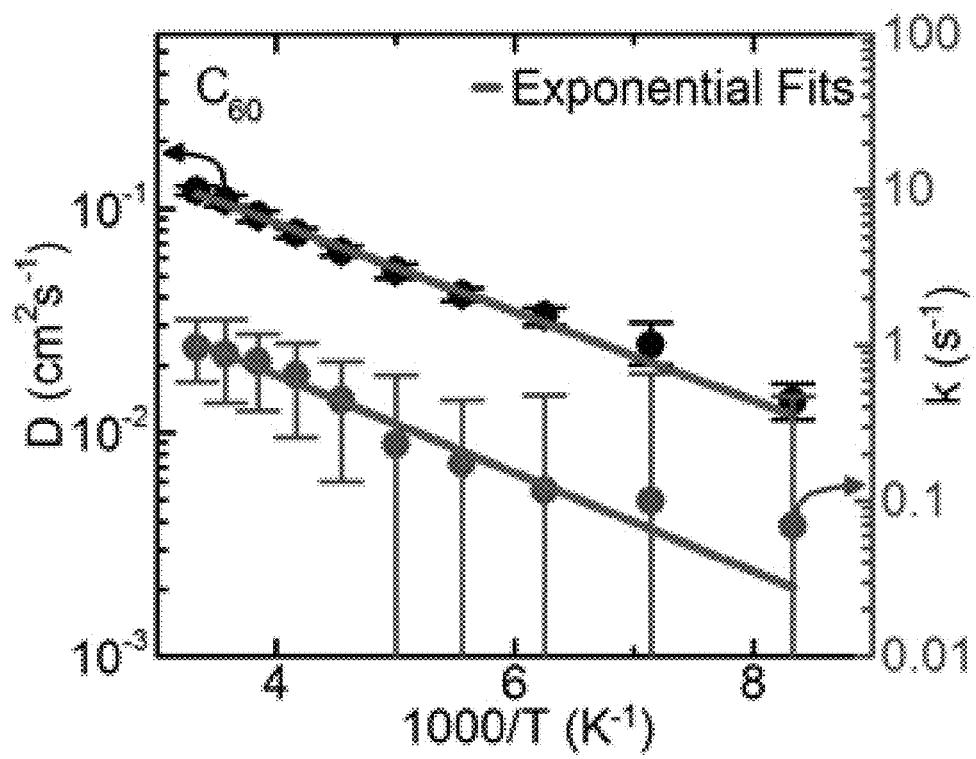
FIG. 7E depicts diffusivity D and k versus temperature T, extracted from the simulations from FIG. 7C for the DTDCTB-(10 nm $C_{60}$)-Neat device. Lines show fits to the parameters.
Figure 7F:
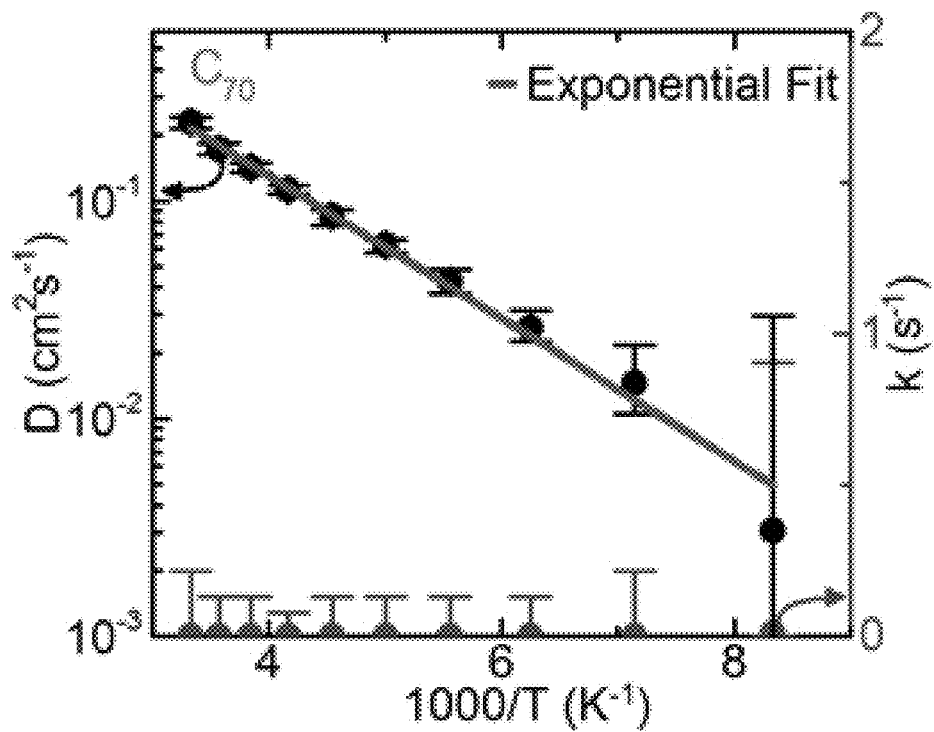
FIG. 7F depicts diffusivity D and k versus temperature T, extracted from the simulations from FIG. 7D for the DTDCTB-(10 nm $C_{70}$)-Neat device. Lines show fits to the parameters.

The diffusivities of DTDCTB-(10 nm $C_{60}$)-neat and DTDCTB-(10 nm $C_{70}$)-neat devices are thermally activated, with activation energies $E_A$=70±8 meV and $E_A$=36±3 meV, respectively (see FIGS. 7E, 7F). The exponential decrease in D with temperature is confirmation that conduction is limited by intermolecular hopping, even though mobilities as high as those measured here are often attributed to bandlike transport. In the $C_{70}$ device, k decreases as a function of temperature ($E_A$=50±11 meV) with nearly the same activation energy as D, suggesting that its $L_D$ is approximately the mean free path between collisions with sparsely distributed defects. In the $C_{60}$ devices, best fits give k<0.1 s−1, which suggests that the electron lifetime is longer than the timescale of the transient measurements. The values of D and k for $C_{60}$ devices, therefore, cannot be used to accurately predict $L_D$. This is consistent with the fact that the total charge collected in the transient measurements does not decrease systematically with distance. However, an error of 25% was estimated in the amount of total charge collected over a distance of 1 cm, and thus a lower bound on diffusion length can be calculated using $\exp(-1\ cm/L_D)=0.75$ (where $L_D$ is in cm), which yields $L_D>3.5$ cm.

In summary, centimeter-scale electron diffusion in a photoactive, fullerene-based heterostructure has been shown, with room-temperature diffusivities of $D=0.67\pm0.06\ cm^2s^{-1}$ for $C_{60}$ and $D=0.16\pm0.01\ cm^2s^{-1}$ for $C_{70}$, and with thermal activation energies of $E_A=70\pm8$ meV and $E_A=36\pm3$ meV, respectively. Among the structures explored, long-range diffusion was observed only when using d-a-a' dipolar donors in the photoactive D/A heterojunction adjacent to the electron-conducting channel. The highly dipolar donors destabilize the HOMO energy of $C_{70}$ by $0.42\pm0.1$ eV in the blends, thereby providing energetic confinement of electrons in the channel. Monte Carlo simulations aided in understanding these results by confirming that even the lower bound of this measured energy barrier (0.32 eV) is sufficient to support centimeter-scale diffusion in the channel. The surprisingly long diffusion lengths suggest the nearly total absence of recombination centers at interfaces or within the conducting fullerene channels, even though the materials form disordered films. These results may prove useful when applied in devices in which long-range charge transport is required. For example, channel currents may open up the possibility of organic optoelectronic devices with unique properties, such as semi-transparent photovoltaics with large-period metal grid cathodes, organic field-effect transistors and lateral photovoltaics. Additionally, energetically confined channels suggest that Hall-effect and lateral time-of-flight experiments are possible for the accurate characterization of organic materials. However, the presence of such channels can also result in anomalously high short-circuit currents during photovoltaic operation. In this circumstance, care must be taken to prevent the overestimation of solar cell efficiency, particularly for small area devices if the active area is overfilled by the illumination source.

Methods

Materials and Device Fabrication

The materials $C_{70}$, $C_{60}$, DTDCPB, DTDCTB, SubPc, DBP and BPhen were purchased commercially and purified via sublimation before device fabrication. Glass substrates were cut into 5 cm×5 cm squares containing four pre-patterned indium tin oxide (ITO) strips (150 nm×1 cm×2.3 cm) as bottom electrodes. Substrates were cleaned by sequential sonications in Tergitol, deionized water, acetone and isopropanol followed by snow-cleaning on a 100° C. hotplate with a stream of gaseous $CO_2$ and a 10-minute ultraviolet-ozone exposure. The photoactive device structure was 150 nm ITO/10 nm $MoO_3$ anode buffer/80 nm donor $C_{70}$ 1:1/fullerene/electron-blocking layer/100 nm Ag. The donor in the heterojunction was DTDCPB, DTDCTB, SubPc or DBP. The fullerene is either $C_{60}$ or $C_{70}$, and the electron blocker is either an 8-nm-thick layer of BPhen or a 10-nm-thick layer of 1:1 BPhen:$C_{60}$ with a 5-nm-thick BPhen cap. Mixed blocking layers are commonly used in OPVs to improve stability and electron extraction efficiency.

Organic materials, metals and $MoO_x$ were deposited at rates of 0.5-1 Å $s^{-1}$ through shadow masks in a vacuum thermal evaporator with a base pressure of $10^{-7}$ torr. Organics and $MoO_3$ were deposited through a large square mask, leaving 1 mm of the substrate uncoated around the periphery for electrical contacts to the ITO. Using a separate shadow mask, 1-mm-wide strips of 100-nm-thick silver films were deposited across the organics to form the cathode, with 0.1 $cm^2$ of intersection perpendicular to the ITO bottom contact, as shown in FIG. 5A. The steady-state photocurrent device was encapsulated using a glass cover sealed to the substrate with a bead of ultraviolet cured epoxy around its periphery.

The electrical injection device had the structure p-type Si (20Ω per square, $\hbar$)/500 nm $SiO_2$/10 nm BPhen/50 nm $C_{60}$/50 nm Ag/20 nm DTDCPB:$C_{70}$ 1:⅛ nm BPhen/100 nm Ag. The 50-nm-thick silver layer (collecting contact), and the 100-nm-thick silver layer (injecting contact) were patterned into 1 mm×18 mm parallel strips using a shadow mask, separated by 1 cm. The substrate oxide was etched, using buffered HF, to allow contact with the silicon in a small area away from the device. For alignment purposes, two electrically inactive silver strips positioned above the collecting contact were deposited simultaneously with the injecting contact. The same heterojunction/channel/electron-blocking layer structure was used to enable a direct comparison between the electrical and optical devices, although long-range diffusion is expected with any trap-free blocking interface.

Transient Photocurrent Measurements

Transient photocurrent measurements were performed under vacuum in an open-loop liquid $N_2$ cryostat with four vacuum feedthroughs for electrical contacts, optical fiber and micrometer positioning arm. The fiber, which had a 25-µm-diameter core with a numerical aperture of 0.1, and a measured Gaussian output width of <40 µm, was positioned normal to the device surface. Pulses (duration of 0.5 ms to 2 ms and delays of 1 s to 100 s between pulses) from diode lasers (wavelengths 405 nm and 637 nm) were focused into the fiber for temporal measurements. The position of the fiber was controlled with an x-y-z micrometer positioning stage. A 99% optically absorptive black foil was placed beneath the device to minimize light scattering. The current response was amplified with a low-noise current amplifier at $10^8$ V $A^{-1}$ and recorded with a digital oscilloscope. Rise time filters between 10 µs and 10 ms were used on the current amplifier to minimize noise, and all spectra were averaged over at least 10 pulses. Temperature was controlled by the liquid $N_2$ flow rate and a resistive heater, and monitored with a thermocouple. The steady-state dark current was subtracted, leaving only the transient response to the light pulses.

Transient Current Measurements

Transient current measurements of the electrical injection device were performed in the dark, under vacuum and at room temperature. The silicon substrate was grounded, the injecting contact was connected to a pulse generator, and the current transient at the collecting contact was measured with a current amplifier ($10^7$ V $A^{-1}$, 10-ms-risetime filter) and digital oscilloscope.

Ultraviolet Photoelectron Spectroscopy

The HOMO energies were measured using ultraviolet photoelectron spectra taken in high vacuum ($10^{-8}$ torr) with a 21.2 eV photon source. Organic thin films were grown on conductive ITO substrates as described above. The lowest unoccupied molecular orbital energies were estimated using the low energy optical absorption edge of the material. The energy barrier between $C_{70}$ in the donor:$C_{70}$ blend and the neat $C_{60}$ layer on top was estimated by measuring the binding energy of the $C_{70}$ HOMO in a 10-nm-thick donor:$C_{70}$ blend with a 5-nm-thick $C_{60}$ cap, measuring the binding energy of the $C_{60}$ HOMO and taking the difference between these energies.

Charge-Diffusion Simulations

Charge dynamics were simulated from a solution to the diffusion equation:

$$\dot{N}(x,y,t) = D\nabla^2 N(x,y,t) - kN(x,y,t) + G(x,y,t), \quad (4)$$

subject to blocking boundary conditions along the edges of the organic film and a quenching boundary condition at the edge of the silver cathode. Here, N is the electron density, x is the distance from the cathode, y is the lateral position, t is the time, D is the diffusivity, k is the sum of the trapping and recombination rates, and G is the generation rate. Initially, $N(x, y, 0) = 0$. The generation term is given by:

$$G(x, y, t) = \frac{Q}{q \cdot t_{pulse}} \frac{1}{2\pi\sigma^2} \left( \frac{(x-x_0)^2 + (y-y_0)^2}{2\sigma^2} \right), \quad (5)$$

where Q is the charge injected into the fullerene transport layer, $\sigma = 40$ μm is the laser beam diameter, $(x_0, y_0)$ and $t_{pulse}$ are the position and length of the excitation, respectively. The intrinsic carrier density in the fullerene layer is typically $<10^8$ cm$^{-3}$, depending on the purity, which is many orders of magnitude below the optically excited and electrically injected charge densities.

The current transient is given by the diffusion current into the cathode as a function of t:

$$I(t) = q \int D \frac{dN(x, y, t)}{dx} \bigg|_{x \to 0} dy. \quad (6)$$

Equations (4)-(6) are solved numerically, and equation (6) is fitted to the data, with parameters D, k, and Q. The diffusivity primarily determines the arrival time of the current pulse and the slope of the falling edge, k determines the slope at long times, and Q scales linearly with amplitude.

Because of the device symmetry and the blocking conditions on the perimeter of the organic films, diffusion parallel to the cathode interface does not affect the arrival time of electrons at the cathode except in the case of diffusion around a cut in the organic film. The simulated geometry is therefore one-dimensional in most cases, simplifying computation.

Diffusion simulations successfully fitted the data in FIGS. 5A-B, 7A-F and 8, except at the leading edge of the current transient. During measurement, some scattered light is absorbed along the channel between the silver edge and the intended point of photoexcitation, generating a prompt current response that is not accounted for by the model. This response is delayed with increasing L, as can be seen in FIG. 5B, as the scattered light is absorbed farther from the cathode. Bandwidth filters were used to reduce noise on the low-amplitude spectra at larger L. Scattered light effects were considerably suppressed by placing a highly absorptive foil beneath the device during all measurements. The resistance-capacitance time constant of the measurement circuit was <100 ns and the amplifier rise-time was <2 μs; both are many orders of magnitude shorter than the current response from the samples.

The falling edge of the electrical injection device transient was also simulated using this method, in which electrons were generated at a constant rate beneath the injecting contact until a steady-state current was reached at the collecting electrode. The collecting contact was placed at $x=0$, with the edge of the injecting contact at $x=1$ cm.

Monte Carlo Simulations

Monte Carlo simulations of charge diffusion were performed on a simple cubic lattice that contained 200×7×100 sites in the x, y and z dimensions, respectively, with lattice constant $a=1$ nm. Here, x and y are the directions parallel to the substrate, and z extends vertically from the substrate. Sites with $z<90a$ were designated as the donor:$C_{70}$ blend, and the top 10 sites represented the neat fullerene channel. The blend was randomly generated, with 50% of the sites occupied by fullerenes, corresponding to a 1:1 blend. Periodic boundary conditions in y were used, with blocking interfaces at $x=0$ (the periphery of the organic films) and $z=100a$ (the interface between the fullerene channel and the electron-blocking layer). Quenching boundary conditions were assumed at $z=0$ (the MoO3/heterojunction interface) and $x=200a$ to collect electrons. Charges originating at (1,1,1) were allowed to diffuse using the Miller-Abrahams hopping rate, as follows: during each step of the computation, a random direction was chosen for an electron hopping attempt, with the probability of success given by $p=\exp(-E/k_BT)$, where E is the energy difference between the two sites. In this equation, $E=E_e$ for hops from the channel to the blend, $E=\infty$ for hops onto donors, and $E=0$ otherwise. This assumes that the barrier for intermolecular hopping can be neglected in the lateral diffusion efficiency calculations as it does not affect the relative probability of hopping over the barrier versus laterally. Energetic disorder, which may decrease the calculated value of $L_D$, is also assumed to be small compared with the $E_B$. The charge-diffusion efficiency over the length of the simulated lattice, $\eta'_D$, is given by the ratio of charges quenched at $x=200a$ versus at $z=0$. Thus, the diffusion efficiency over a distance, x, is given by: $\eta_D(x) = (\eta'_D)^{x/d}$, where d is the length of the simulated lattice and the charge-diffusion length is: $L_D = -d/\ln(\eta'_D)$.

Photovoltaic Characterization

Current-voltage characteristics were measured using a semiconductor parameter analyzer both in the dark and under 100 mW cm$^{-2}$ of AM1.5G filtered illumination from a xenon arc lamp. External quantum efficiency was measured with a lock-in current amplifier in response to a calibrated monochromated light source chopped at 100 Hz. The steady-state device response to 633-nm illumination was measured using an identical set-up to that described for transient photocurrent measurements with a 10 mW He—Ne laser focused into the fiber.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

What is claimed is:

1. An optoelectronic device, comprising:
   an anode;
   a cathode arranged in a grid structure having a plurality of electrode segments and a respective opening between adjacent segments of the cathode;
   an active layer positioned between the anode and the cathode, the active layer comprising at least one organic donor material and at least one acceptor material; and a channel layer positioned between the cathode and the active layer, wherein the channel layer is configured to laterally disperse a charge across the channel layer;

an electron blocking layer positioned between the channel layer and the cathode, in direct contact with the channel layer and the cathode;

wherein an interface between the active layer and the channel layer has an energy barrier of at least 0.1 eV, configured to confine electrons within the channel layer.

2. The optoelectronic device of claim 1, the channel layer comprising fullerene.

3. The optoelectronic device of claim 2, wherein the channel layer has a neat fullerene composition.

4. The optoelectronic device of claim 3, wherein the neat fullerene composition is $C_{60}$ or $C_{70}$.

5. The optoelectronic device of claim 1, wherein the channel layer has a thickness of between 1 nm and 25 nm.

6. The optoelectronic device of claim 1, wherein the electron blocking layer is a neat electron blocking layer.

7. The optoelectronic device of claim 1, wherein the electron blocking layer is a mixed electron blocking layer.

8. The optoelectronic device of claim 1, wherein the electron blocking layer comprises a material selected from the group consisting of BPhen and fullerene.

9. The optoelectronic device of claim 1, wherein the electron blocking layer has a thickness of between 5 nm and 15 nm.

10. The optoelectronic device of claim 1, wherein the electron blocking layer comprises a 1:1 volumetric ratio of fullerene and BPhen.

11. The optoelectronic device of claim 1, wherein a diffusion constant D of the channel layer is at least 0.5 cm$^2$/s.

12. The optoelectronic device of claim 1, wherein the at least one donor material is selected from the group consisting of DTDCPB and DTDCTB.

13. The optoelectronic device of claim 1, wherein the at least one acceptor material is fullerene.

14. The optoelectronic device of claim 1, wherein the optoelectronic device comprises an organic photovoltaic cell having a power conversion efficiency of at least 12%.

15. The optoelectronic device of claim 1, wherein the optoelectronic device comprises an organic photovoltaic cell having a power conversion efficiency of at least 14%.

16. A product comprising the optoelectronic device of claim 1, wherein the product is selected from the group consisting of a photovoltaic cell, a charge-coupled device, and a photosensor.

17. The optoelectronic device of claim 1, wherein the device has a photocurrent response of at least 5% to incident light received at an opening between the grid electrode segments, at a distance of 1 cm away from any grid electrode segment.

* * * * *